United States Patent
de Rochemont

(10) Patent No.: US 11,201,007 B2
(45) Date of Patent: *Dec. 14, 2021

(54) MODULATED INDUCTANCE MODULE

(71) Applicant: L. Pierre de Rochemont, Raleigh, NC (US)

(72) Inventor: L. Pierre de Rochemont, Raleigh, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 16/680,324

(22) Filed: Nov. 11, 2019

(65) Prior Publication Data

US 2020/0328022 A1 Oct. 15, 2020

Related U.S. Application Data

(63) Continuation of application No. 14/560,935, filed on Dec. 4, 2014, now Pat. No. 10,475,568, which is a (Continued)

(51) Int. Cl.
  *H01F 27/28* (2006.01)
  *H01F 41/04* (2006.01)
  (Continued)

(52) U.S. Cl.
  CPC .......... *H01F 27/2804* (2013.01); *B82Y 30/00* (2013.01); *H01C 7/003* (2013.01); *H01C 17/003* (2013.01); *H01C 17/06533* (2013.01); *H01F 3/00* (2013.01); *H01F 5/003* (2013.01); *H01F 27/24* (2013.01); *H01F 27/29* (2013.01); *H01F 27/40* (2013.01); *H01F 41/041* (2013.01); *H01G 4/10* (2013.01); *H01G 4/33* (2013.01); *H01L 23/64* (2013.01);
  *H01L 28/10* (2013.01); *H05K 1/162* (2013.01); *H05K 1/165* (2013.01); *H05K 1/167* (2013.01); *C04B 2235/768* (2013.01);
  (Continued)

(58) Field of Classification Search
  CPC ......... H01F 27/2804; H01F 5/00; H01F 27/28
  USPC .................................................. 336/200, 233
  See application file for complete search history.

(56) References Cited

U.S. PATENT DOCUMENTS 2,977,311 A * 3/1961 Guillaud ............. C04B 35/2633
  252/62.58
3,035,896 A * 5/1962 Brixner ................. C04B 35/495
  423/263
(Continued)

FOREIGN PATENT DOCUMENTS

FR    2807425 A1 * 10/2001  ............... H01B 3/12
JP    06140206 A  *  5/1994

*Primary Examiner* — Tszfung J Chan
(74) *Attorney, Agent, or Firm* — Burns & Levinson LLP; Jerry Cohen; Joseph P. Quinn

(57) ABSTRACT

A modulated inductance module includes an inductor including one or more electrical conductors disposed around a ferromagnetic ceramic element formed on a semiconductor die, wherein the inductor further has two or more metal oxides having fluctuations in metal-oxide compositional uniformity less than or equal to 1.50 mol % throughout said ceramic element, the ceramic element has crystalline grain structure having a diameter that is less than or equal to 1.5× a mean grain diameter, and the semiconductor die contains active semiconductor switches or rectifying components that are in electrical communication with the one or more electrical conductors of the inductor.

20 Claims, 41 Drawing Sheets

TOP VIEW

Related U.S. Application Data continuation of application No. 13/735,942, filed on Jan. 7, 2013, now abandoned, which is a continuation of application No. 11/620,042, filed on Jan. 4, 2007, now Pat. No. 8,350,657, which is a continuation-in-part of application No. 11/479,159, filed on Jun. 30, 2006, now Pat. No. 8,715,839.

(60) Provisional application No. 60/695,485, filed on Jun. 30, 2005.

(51) Int. Cl.

| | | |
|---|---|---|
| *H01F 27/24* | (2006.01) | |
| *H01G 4/33* | (2006.01) | |
| *H01C 17/065* | (2006.01) | |
| *H05K 1/16* | (2006.01) | |
| *H01G 4/10* | (2006.01) | |
| *H01C 17/00* | (2006.01) | |
| *H01C 7/00* | (2006.01) | |
| *B82Y 30/00* | (2011.01) | |
| *H01L 23/64* | (2006.01) | |
| *H01F 3/00* | (2006.01) | |
| *H01F 5/00* | (2006.01) | |
| *H01F 27/29* | (2006.01) | |
| *H01F 27/40* | (2006.01) | |
| *H01L 49/02* | (2006.01) | |
| *H05K 1/09* | (2006.01) | |
| *H05K 1/02* | (2006.01) | |
| *H05K 3/20* | (2006.01) | |

(52) U.S. Cl.
CPC .............. *C04B 2235/781* (2013.01); *H01F 2027/2809* (2013.01); *H01L 2224/16* (2013.01); *H01L 2924/0102* (2013.01); *H01L 2924/01019* (2013.01); *H01L 2924/01021* (2013.01); *H01L 2924/01025* (2013.01); *H01L 2924/01037* (2013.01); *H01L 2924/01057* (2013.01); *H01L 2924/01067* (2013.01); *H01L 2924/01077* (2013.01); *H01L 2924/01078* (2013.01); *H01L 2924/01079* (2013.01); *H01L 2924/3011* (2013.01); *H01L 2924/3025* (2013.01); *H05K 1/0298* (2013.01); *H05K 1/092* (2013.01); *H05K 3/207* (2013.01); *H05K 2201/017* (2013.01); *H05K 2201/0175* (2013.01); *H05K 2201/09763* (2013.01); *H05K 2203/016* (2013.01); *H05K 2203/0338* (2013.01); *H05K 2203/121* (2013.01); *Y10T 29/49021* (2015.01)

(56) References Cited

U.S. PATENT DOCUMENTS

| | | | | |
|---|---|---|---|---|
| 3,179,525 | A * | 4/1965 | Welsby | C04B 35/465 501/136 |
| 3,304,199 | A * | 2/1967 | Faber, Sr. | C03C 3/072 428/426 |
| 3,479,631 | A * | 11/1969 | Harget et al. | H01C 7/045 338/22 R |
| 3,583,931 | A * | 6/1971 | Bouchard | C04B 35/01 252/519.13 |
| 5,070,317 | A * | 12/1991 | Bhagat | B81B 7/0077 257/531 |
| 5,844,523 | A * | 12/1998 | Brennan | H01Q 1/2225 343/700 MS |
| 2002/0177519 | A1* | 11/2002 | Kawamoto | C04B 35/64 501/139 |
| 2003/0071326 | A1* | 4/2003 | Lin | H01L 23/5329 257/531 |
| 2003/0127704 | A1* | 7/2003 | Kobayashi | H01L 23/552 257/531 |
| 2004/0012081 | A1* | 1/2004 | Kwon | H01L 25/16 257/678 |

* cited by examiner

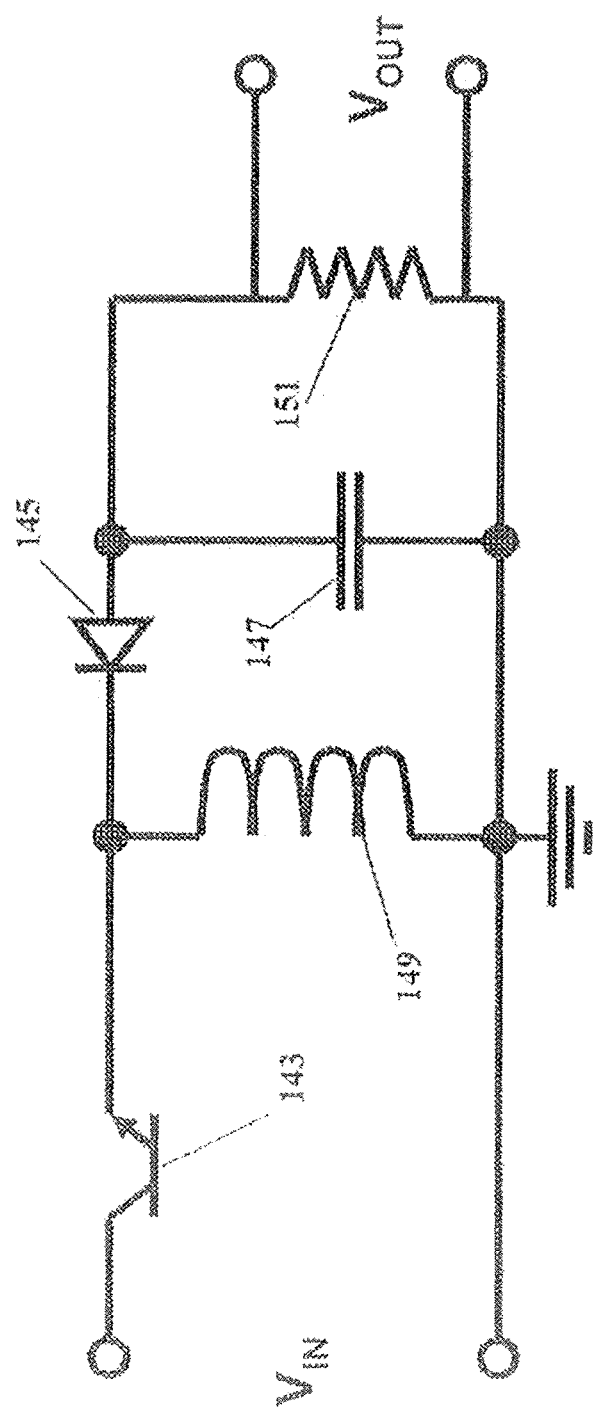

TOP VIEW

TOP VIEW

END VIEW

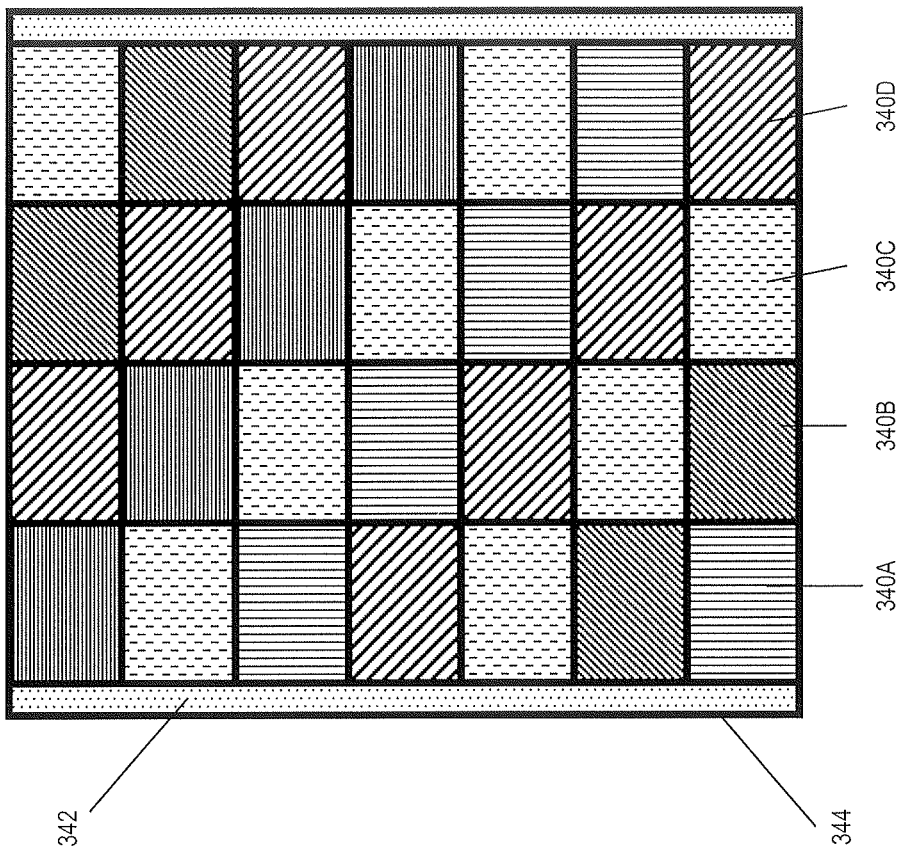
FIG. 14A2
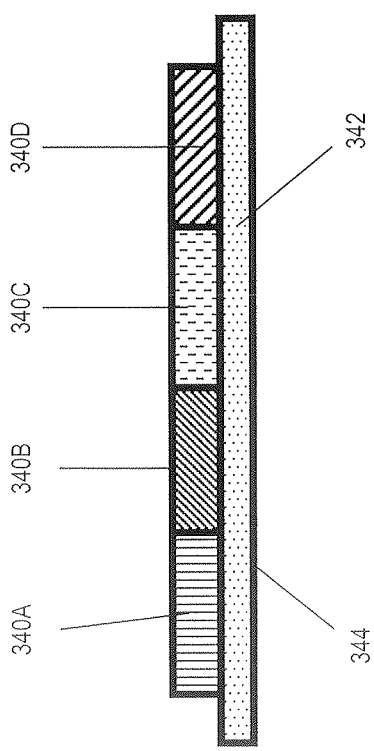
FIG. 14A1

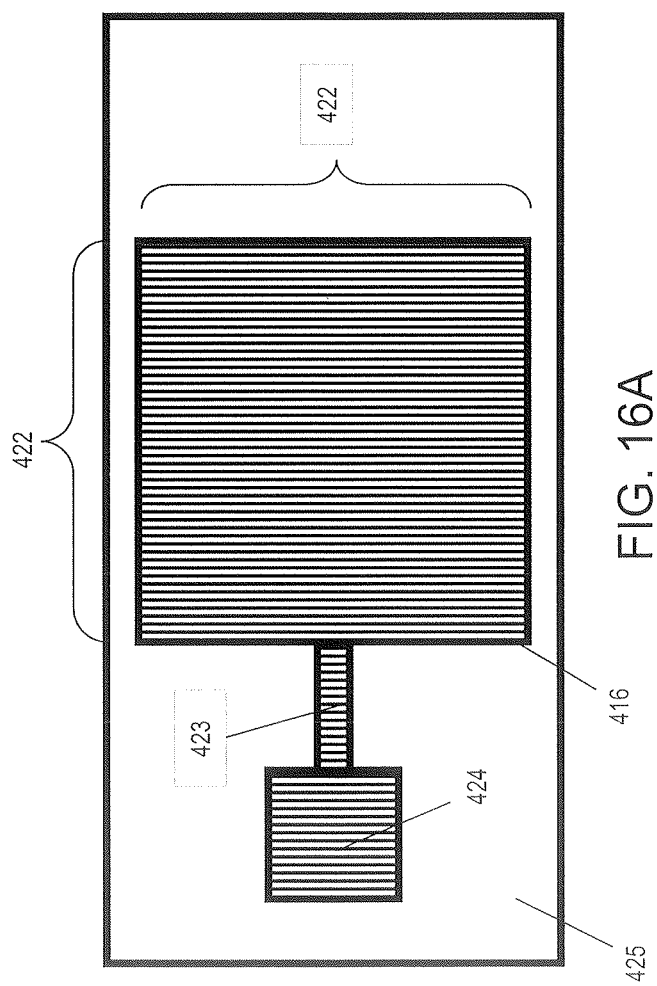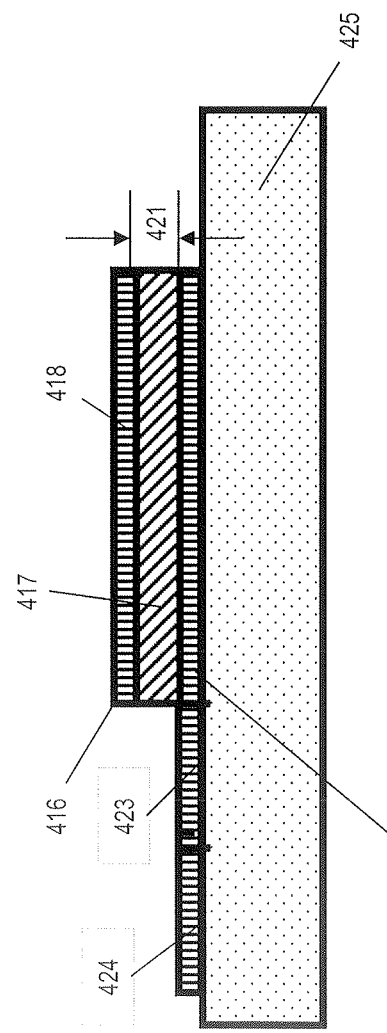
FIG. 16A
FIG. 16B

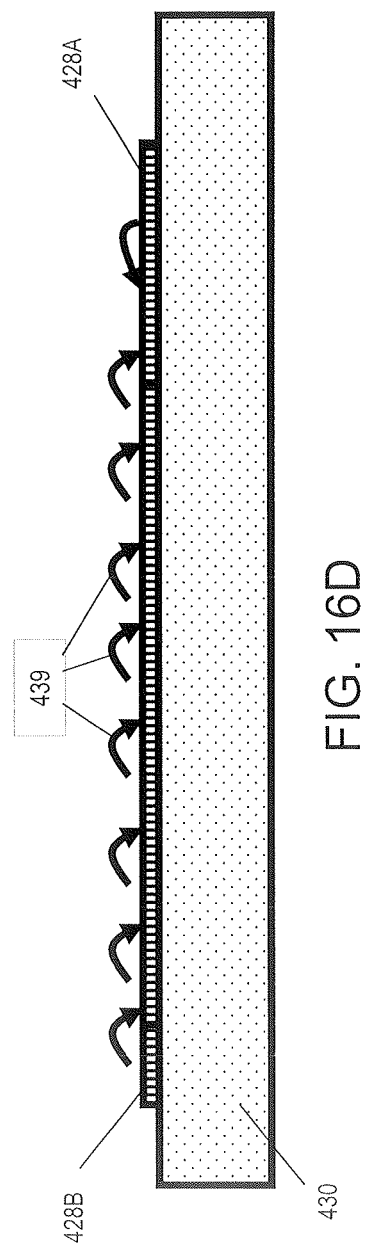

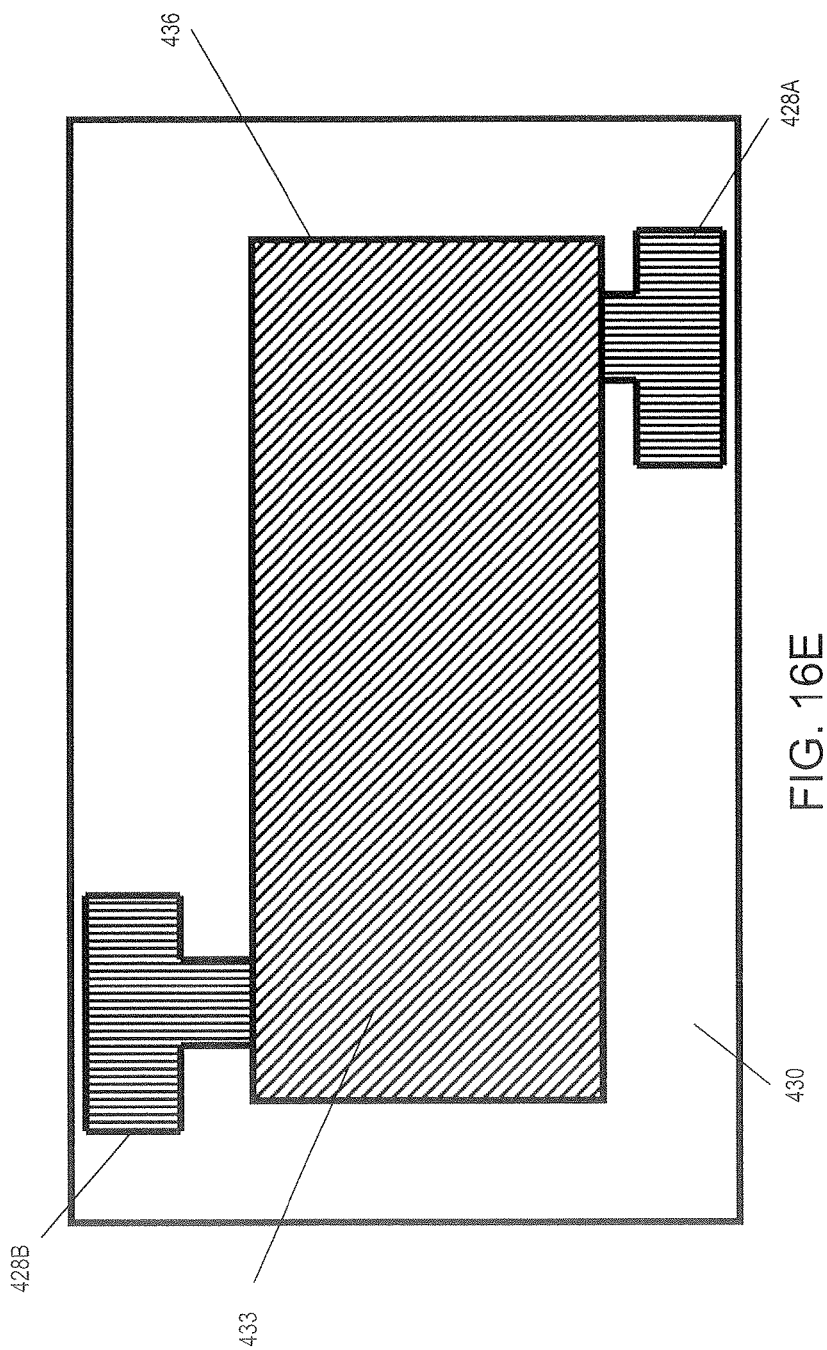
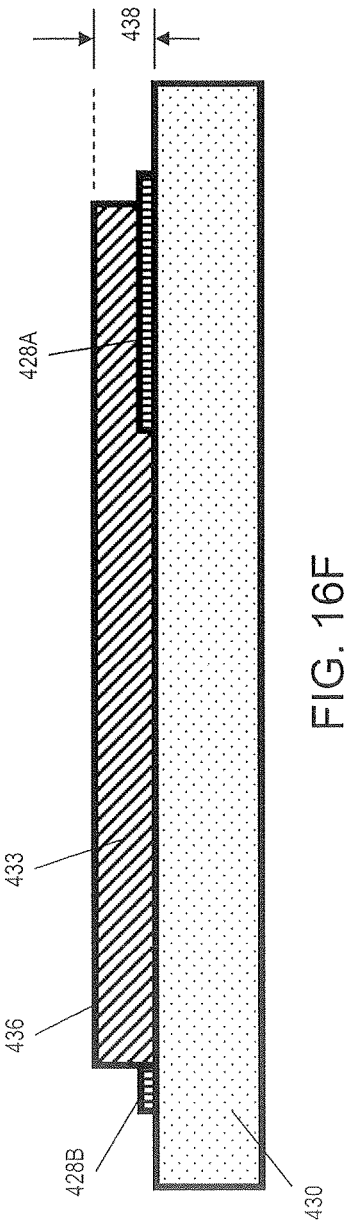
FIG. 16E
FIG. 16F

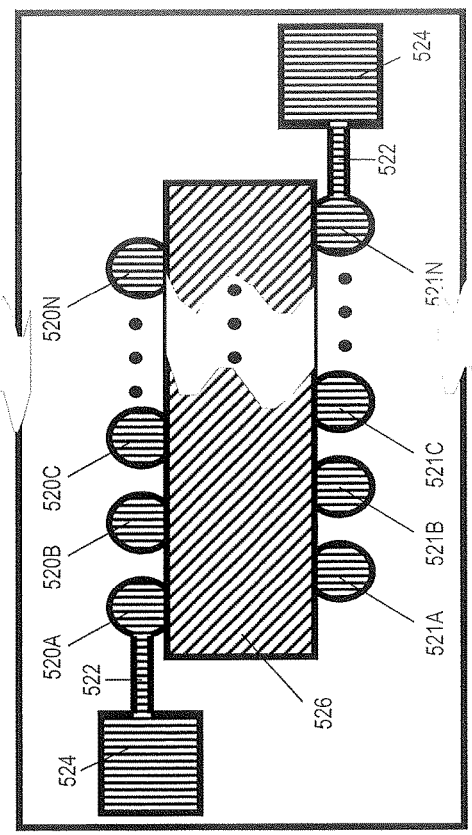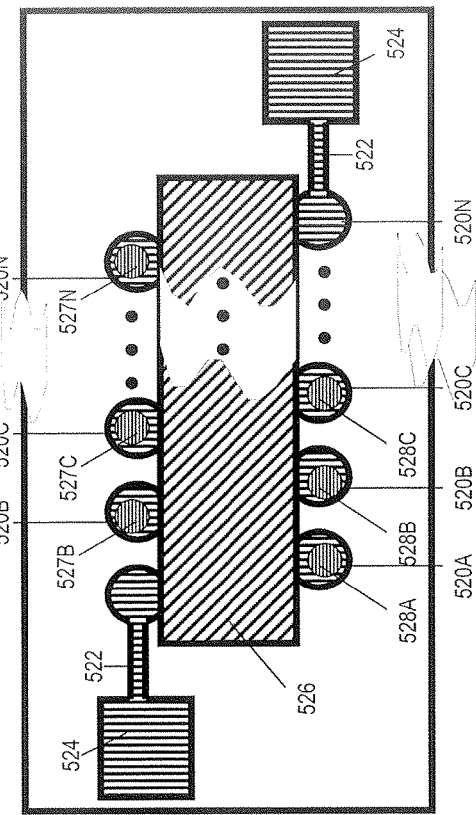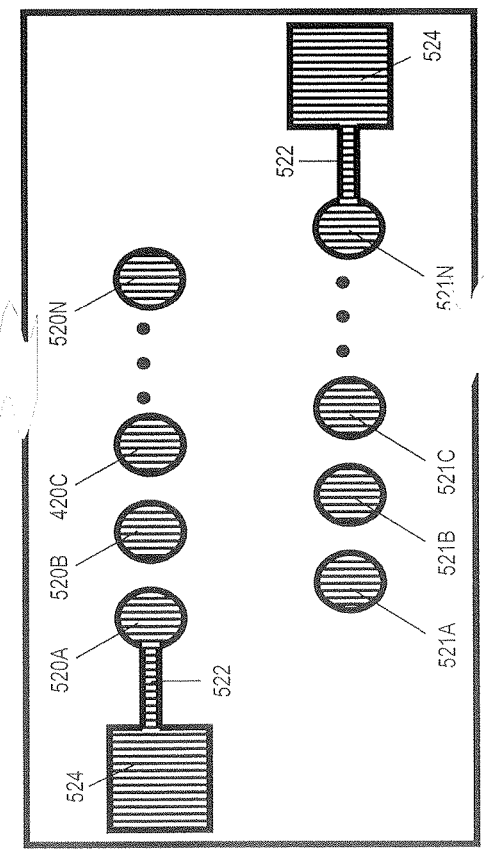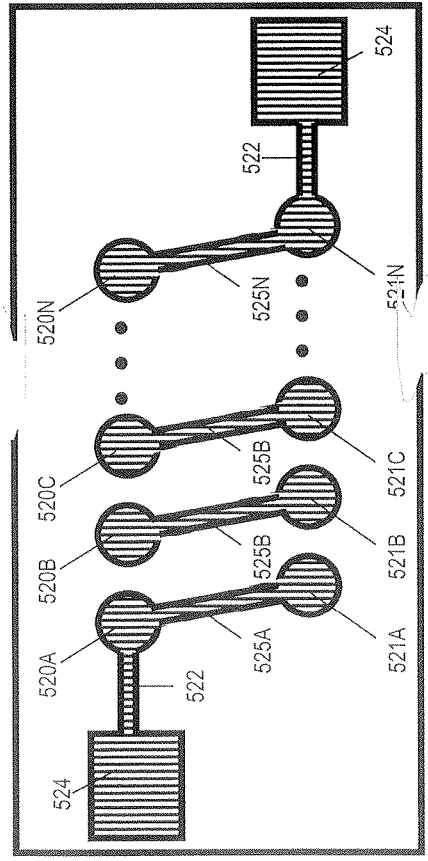

TOP VIEW

TOP VIEW

TOP VIEW

TOP VIEW

TOP VIEW

END VIEW

MODULATED INDUCTANCE MODULE

RELATED PATENT APPLICATIONS

This application is a continuation of U.S. patent application Ser. No. 14/560,935, filed Dec. 4, 2014, which is a continuation of U.S. patent application Ser. No. 13/735,942, filed Jan. 7, 2013, which is a continuation of Ser. No. 11/620,042, filed Jan. 4, 2007, now U.S. Pat. No. 8,350,657, which is a Continuation-in-Part of U.S. patent application Ser. No. 11/479,159, filed Jun. 30, 2006, now U.S. Pat. No. 8,715,839, which claims priority from U.S. Provisional Patent Application No. 60/695,485, filed Jun. 30, 2005.

FIELD OF THE INVENTION

The present invention relates specifically to the design and construction of electrical modules that are used to manage power levels in electrical appliances and electronic devices, and in particular, to the design and construction of a solid state power management module that comprises at least one ferromagnetic ceramic solenoid inductor integrated within its interior body or physically attached to an exterior surface.

BACKGROUND

A power management device 101 is used to translate the voltage level and current type supplied by a power source 103 to the voltage level and current-type rated for an electrical appliance or electronic device 105 as shown in FIG. 1. The available power source 103 can comprise an alternating current (AC) source or a direct current (DC) source. Alternatively, the electrical appliance or electronic device 105 may also be rated to function under an AC or DC voltage. Conductive means 107 is used to maintain electrical communication between the power management device 101, the power source 103 and the electrical appliance 105. A power management device 101 that translates AC power from the supplied voltage and current level to a different desired AC voltage and current level functions as a transformer device. When said power management device 101 translates AC power from the supplied voltage and current level to a desirable DC voltage and current it operates as an AC-to-DC converter. When said power management device 101 translates a non-optimal DC electrical power supply to DC voltage and current levels rated for the electrical appliance, it operates as a DC-to-DC converter. When the power management device 101 translates a DC electrical power supply to an AC current, it operates as a power inverter. Methods and articles that improve component integration, device miniaturization and performance tolerances of power management devices over current means are beneficial to the development of smaller form factor, lighter weight, and lower cost fixed or mobile platform electrical appliance. All of these power management devices will consist of at least one inductor component, which typically has larger size than any other electrical component used in the assembly of the power management device 101. Therefore, means that reduce the footprint (size) or improve performance tolerances of the inductor component, or facilitate component integration address a significant need of power management devices.

The basic layout of a transformer circuit is shown in FIG. 2. A transformer circuit 109 will consist of an inductor core 111 in which a magnetic current is generated by a primary coil winding 113. One or more secondary coil windings 115, 117 that are also wrapped around the inductor core 111 generate electrical currents in response to the magnetic current running through it. As is well known to practitioners skilled in the art, the voltage $V_S$ generated in the secondary coil windings 115, 117 is proportional to the voltage $V_P$ applied to the primary coil through the ratio of the number of turns in the primary winding $N_P$ and the secondary coil(s) $N_S$ through:

$$\text{i. } V_P/V_S = N_P/N_S. \tag{1}$$

The basic circuit layout of an inverter circuit is shown in FIG. 3. An inverter circuit 119 will consist of a DC power supply (battery, fuel cell, solar cell, etc.) 121, at least two transistor switches 123A, 123B, input coils 125A, 125B, 125C that are coupled to an output coil 127 through an inductor core 129. Inverter circuits may optionally include rectifying diodes 131A, 131B. Inverter circuits and transformer circuits may also include additional resistors and capacitors (not shown in FIGS. 2 and 3) used as filtering components.

DC-to-DC converter circuits use four primary building block circuits, alternatively known to practitioners skilled in the art as pumps, to derive their operational characteristics. The four pump circuit classifications are Fundamental pumps, Developed pumps, Transformer pumps, and Super-lift pumps. Fundamental pumps are sub-categorized as Buck pumps, Boost pumps, and Buck-Boost pumps. FIG. 4A depicts the circuit layout of a Buck-Boost pump 133. The Fundamental pumps will consist of a transistor or electromechanical switch 135, a rectifying diode 137, a resistor 139 and an inductor 141. Developed pumps are sub-categorized as Positive Luo pumps, Negative Luo pumps, or C k pumps. FIG. 4B depicts the circuit layout of a negative Luo pump. Developed pumps will comprise a transistor or electromechanical switch 143, a rectifying diode 145, a capacitor 147, an inductor 149, and a resistor 151. Transformer pumps are sub-categorized as Forward pumps, Fly-Back pumps, and Zeta pumps. FIG. 4C depicts the circuit layout of a Fly-back pump. Transformer pumps will comprise a transistor or electromechanical switch 153, a transformer 155, one or more rectifying diodes 157, a capacitor 159 and a resistor 161. Super-lift pumps are sub-categorized as Positive Super Luo pumps, Negative Super Luo pumps, Positive Push-Pull pumps, Negative Push-Pull pumps, and Double/Enhanced Circuit (DEC) pumps. FIG. 4D depicts the circuit layout of a Positive Super Luo pump. Super-lift pumps will comprise a transistor or electromechanical switch 163, at least two rectifying diodes 165A, 165B, at least two capacitors 167A, 167B, a resistor 169, and an inductor 171. These building block circuits are then assembled to form DC-to-DC converter circuits meeting specific operational design characteristics. A more comprehensive description of DC-to-DC converter circuits is contained in F. L. Luo and H. Ye, "Essential DC/DC Converters", CRC Press, Taylor and Francis Group, Boca Raton, Fla. 2006, which is incorporated herein by way of reference.

U.S. Pat. No. 6,027,826 to de Rochemont, et al., disclose articles and methods to form oxide ceramic on metal substrates to form laminate, filament and wire metal-ceramic composite structures using metalorganic (molecular) precursor solutions and liquid aerosol spray techniques. U.S. Pat. Nos. 6,323,549 and 6,742,249 to de Rochemont, et at, disclose articles that comprise, and methods to construct, an interconnect structure that electrically contacts a semiconductor chip to a larger system using at least one discrete wire that is embedded in silica ceramic, as well as methods to embed passive components within said interconnect structure using metalorganic (molecular) precursor solutions and liquid aerosol spray techniques. U.S. Pat. Nos. 5,707,715 and 6,143,432 to de Rochemont, et al., disclose articles and methods to relieve thermally-induced mechanical stress in metal-ceramic circuit boards and metal-ceramic and ceramic-ceramic composite structures prepared from a solution of metalorganic (molecular) precursors, and further discloses the incorporation of secondary phase particles (powders) in said solution of said solution of metalorganic (molecular) precursors. U.S. patent application Ser. No. 11/243,422 discloses articles and methods to impart frequency selectivity and thermal stability to a miniaturized antenna element, and the construction of simplified RF front-end architectures in a single ceramic module. U.S. patent application Ser. No. 11/479,159 discloses articles and methods to embed passive components (resistors, capacitors, and inductors) having stable performance tolerances over standard operating temperatures within a solid state circuit. This application further discloses a solenoid inductor comprising a core of high permeability ferromagnetic ceramic surrounded by an electrically conducting coil, and methods to make same. The contents of each of these references are incorporated herein by reference as if laid out in their entirety.

DEFINITION OF TERMS

The term circuit board is hereinafter defined to mean a passive circuit comprising a single dielectric layer or a plurality of stacked dielectric layers on which conductive traces have been printed or applied that is used to route electrical or electronic signals between one or more semiconductor devices, passive components, and power sources within a larger electronic system. For the purpose of this invention, circuit board may be understood to mean a back plane, a mother board, or a daughter card.

The term "AC-to-DC Converter" is hereinafter defined to mean a circuit module including at least one inductor element, at least one capacitor element, optionally one or more resistor elements, and, at least one rectifying transistor diode that translates the voltage of an AC power source, to a DC voltage and current useful to the operation of a DC electrical appliance.

The term "DC-to-DC Converter" is hereinafter defined to mean a circuit module including at least one inductor element, at least one capacitor element, optionally one or more resistor elements, and at least one rectifying transistor diode that translates the voltage of a DC power source, such as a battery, fuel cell, or solar cell, to an alternative DC voltage and current useful to the operation of DC electrical appliance.

The term "electrical appliance" is hereinafter defined to mean any device that requires electrical current (AC or DC) to perform an intended function.

The term "electroceramic" is hereinafter defined to mean a ceramic composition that comprises two or more metal oxide components, wherein said metal oxide components have been selected to produce a specific electrical or dielectric response or physical property, such as, dielectric constant (principally defined by the materials relative permittivity (.di-elect cons..sub.R), relative permeability (.mu..sub.R), and loss tangent (tan .delta.)) or electrical resistivity, etc.

The term "ferroelectric" is used to define a state of spontaneous polarization generated by the collective displacement of ions within the lattice of certain ionic crystals that produces a state of internal electrical polarization without the application of an external electric field. Ferroelectric materials are characterized by a transition-temperature, known as the Curie transition-temperature, below which the ionic crystal displays paraelectric behavior.

The term "ferromagnetic" is used to define a material that generates increased magnetic flux densities when under the influence of an applied magnetic field. Ferromagnetic materials are characterized as having a relative dielectric permeability that is greater than unity, .mu..sub.R>1.

The term "anti-ferromagnetic" is used to define a material that decreases magnetic flux densities when under the influence of applied magnetic field by generating lines of magnetic flux that are anti-parallel to the magnetic flux lines generated by the applied magnetic field. Anti-ferromagnetic materials are characterized as having a relative dielectric permeability that is less than unity, .mu..sub.R<1.

The term "interconnect" is hereinafter defined to mean passive circuit comprising a single dielectric layer or a plurality of stacked dielectric layers on which conductive traces have been printed or applied that is used to route electrical or electronic signals between one or more semiconductors, passive components, power sources, and a circuit board within a larger electronic systems. For the purpose of this invention, interconnect is understood to mean a smaller wiring structure that is inserted between one or more semiconductor devices and a circuit board, such that the combination of the interconnect and the one or more semiconductor devices functions as a module, or a subsystem module.

The acronym "LCD" is hereinafter defined to refer to liquid chemical deposition. Liquid chemical deposition is hereinafter defined to mean the method whereby low-volatility metalorganic salt solutions containing metal oxide precursors to a desired ceramic composition, preferably carboxylate salt precursors, are used to deposit a desired oxide composition by means of a liquid aerosol spray on a substrate heated to temperatures between 250.degree. C. and 500.degree. C., preferably 325.degree. C. and 430.degree. C., or by means of a wax-based inkjet system on substrates held at temperatures below 350.degree. C., preferably below 250.degree. C.

The term "LCD ceramic solenoid inductor" is hereinafter defined to mean a solenoid inductor comprising an conducting coil that is wound around a ferromagnetic or anti-ferromagnetic ceramic body, wherein said ceramic body is characterized as consisting of ceramic grains wherein 100% of all the ceramic grains have physical dimensions that are less than or equal to 1.5.times. the mean grain size of the ceramic body.

The term "metalorganic precursor" is hereinafter understood to describe an organic molecule to which a specific metal atom has been attached to a carbon atom through an intermediate oxygen bond.

The term "nano-particle conductive pastes" is hereinafter understood to describe a flowable precursor that consists of fine metal particles, with particle dimensions ranging from 10 nm to 100 nm, and additional chemical additives that can be used to screen print or inkjet high quality metallization layers with low conversion temperatures in the range or 100.degree. C. to 350.degree. C.

The term "organometallic precursor" is hereinafter understood to describe an organic molecule to which a desired metal atom has been attached directly to a carbon atom.

The term "paraelectric" is used to define a condition in which a material does not possess internal electrical polarization in the absence of electrical fields.

The term "passive component" is hereinafter understood to describe an elemental resistor, capacitor, or inductor.

The term "power inverter" or simply "inverter" is hereinafter understood to define a power management device that converts the electrical power provided by a DC power supply, such as a battery, fuel cell, or solar cell, into an alternating current.

The term "power management module" is herein understood to define an integrated device that functions as a power inverter, a transformer, an AC-to-DC converter, or a DC-to-DC converter.

The term "rapid thermal annealing" is hereinafter understood to describe a heating process wherein a combination of resistive heat and focused radiation are applied to material layers deposited on the surface of substrate in such a way that cause said deposited material layers to be heated to internal temperatures sufficient to initiate crystallization processes in said deposited materials for a short duration of time, but leaves said substrate largely unaffected by the rapid thermal annealing process even if said substrate is susceptible to change in material phase at internal temperatures significantly lower than those used to crystallize said deposited materials. Focused radiation normally is understood to mean an absorptive wavelength of infrared, visible, or ultraviolet light delivered using a laser, a pulsed laser, or one or more lamps. Focused radiation may also include microwave radiation. Controlled gas atmospheres may also need to be used during a rapid thermal annealing process.

The term "standard operating temperatures" is hereinafter understood to mean temperatures in the range of −40.degree. C. to +125.degree. C.

The term "transformer" is hereinafter understood to mean any device consisting of at least two solenoid inductors, and optionally including one or more of the following: a capacitive element, a resistive element, or a transistor diode, wherein said transformer is used to transform an AC source voltage to an alternative AC voltage that useful to the proper operation of a given electrical appliance.

SUMMARY OF THE INVENTION

One embodiment of the present invention provides a modulated inductance module comprising: an inductor including one or more electrical conductors disposed around a ferromagnetic ceramic element formed on a semiconductor die, wherein the inductor further comprises two or more metal oxides having fluctuations in metal-oxide compositional uniformity less than or equal to 1.50 mol % throughout said ceramic element, the ceramic element has crystalline grain structure having a diameter that is less than or equal to 1.5× a mean grain diameter, and the semiconductor die contains active semiconductor switches or rectifying components that are in electrical communication with the one or more electrical conductors of the inductor.

The one or more electrical conductors may form a plurality of electrical connections to the active switches or rectifying components of the inductor to enable selective variation of the inductance of the inductor. The inductor may form a transformer coil.

The inductor may be part of a system-on-chip. The inductor may be electrically connected to circuitry within said semiconductor die.

The ferroelectric ceramic element may comprise one or more metal oxides that form a body-centered cubic crystalline phase that includes iron oxide ($Fe_2O_3$) and amounts of one or more metal oxides selected from: cobalt monoxide (CoO), nickel oxide (NiO), zinc oxide (ZnO), manganese oxide (MnO), copper oxide (CuO) vanadium oxide (VO), magnesium oxide (MgO) and lithium oxide ($Li_2O$).

The ferromagnetic ceramic element may comprise silicon oxide (SiO4) and adopts a rhombic dodecahedron or rhombic trapezohedron crystalline phase with other metal oxides that include amounts of one or more of: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$), neodymium oxide ($Nd_2O_3$) and holmium oxide ($Ho_2O_3$).

The ferromagnetic ceramic element may have a magnetic permeability that varies 5% over an operating temperature range of −40° C. to +125° C. The ferromagnetic ceramic element may have a magnetic permeability that varies 1% over an operating temperature range of −40° C. to +125° C.

The module may include a resistive ceramic element formed on the semiconductor die that is electrically connected to the inductor or active circuitry or rectifying components embedded in the semiconductor die. The resistive ceramic element may comprise one or more metal oxides forming a rutile, pyrochlore, or perovskite crystalline phase that includes amounts of copper oxide (CuO), nickel oxide (NiO), ruthenium oxide (Ru $O_2$), iridium oxide (Ir $O_2$), rhodium oxide ($Rh_2O_3$), osmium oxide ($Os_2O_3$), antimony oxide ($Sb_2O_3$) or indium-tin oxide. The one or more metal oxides may include metal oxides from the group consisting of: bismuth oxide ($Bi_2O_3$), lanthanum oxide ($La_2O_3$), cerium oxide ($Ce_2O_3$), neodymium oxide ($Nd_2O_3$) and lead oxide (PbO). The one or more metal oxides may include alkaline earth metal oxides from the group consisting of magnesium oxide (MgO), calcium oxide (CaO), strontium oxide (SrO), and barium oxide (BaO) or transition metal oxides from the group consisting of scandium oxide ($Sc_2O_3$), titanium oxide ($Ti_2O_3$), vanadium oxide ($V_2O_3$), chromium oxide ($Cr_2O_3$), manganese oxide ($Mn_2O_3$), and iron oxide ($Fe_2O_3$). The resistive ceramic element of claim 10 may have a resistivity that varies ≤1% over an operating temperature range of −40° C. to +125° C.

The module may include a capacitive ceramic element formed on the semiconductor die that is electrically connected to the inductor coil or active circuitry or rectifying components embedded in the semiconductor die. The capacitive ceramic element may comprise one or more metal oxides forming a perovskite crystalline structure, wherein the one or more metal oxides may include amounts selected from: alkaline earth metals that include magnesium oxide (MgO), calcium oxide (CaO), strontium oxide (SrO), and barium oxide (BaO), alkali metals that include lithium oxide ($Li_2O$), sodium oxide ($Na_2O$), potassium oxide ($K_2O$), and rubidium oxide ($Rb_2O$), heavy-metal oxides that include lanthanum oxide ($La_2O_3$), cerium oxide ($Ce_2O_3$), neodymium oxide ($Nd_2O_3$), or lead oxide (PbO), and transition-metal oxides that include titanium oxide ($TiO_2$), zirconium oxide (ZrO), hafnium oxide (HfO), tantalum oxide ($Ta_2O_3$), and niobium oxide ($Nb_2O_3$). The capacitive element may have an electrical permittivity that varies ≤1% over an operating temperature range of −40° C. to +125° C. The capacitive element may have an electrical permittivity value of $\varepsilon_R \geq 100$.

The module may include one or more ceramic capacitive elements or one or more resistive elements formed on the semiconductor that are operatively connected to one another and/or the inductor to form an electronic filter. The module may be in electrical connection with an antenna.

BRIEF DESCRIPTION OF THE FIGURES

For a better understanding of the present invention, together with other and further aspects thereof, reference is made to the following description taken in conjunction with the accompanying figures of the drawing, wherein:

FIGS. 4A, 4B, 4C, 4D show schematics of basic pump circuits as elemental building blocks in the assembly of DC-to-DC converters;

FIGS. 14A1, 14A2 and 14B are schematic diagrams of other steps used for constructing the present embodiments;

FIGS. 16A-G are schematic views of process steps used for constructing a capacitor for him is the present embodiments;

FIGS. 17A-17G are schematic views of process steps used for fabricating an inductor in accordance with the present embodiments;

DETAILED DESCRIPTION OF THE INVENTION

Figure 1:
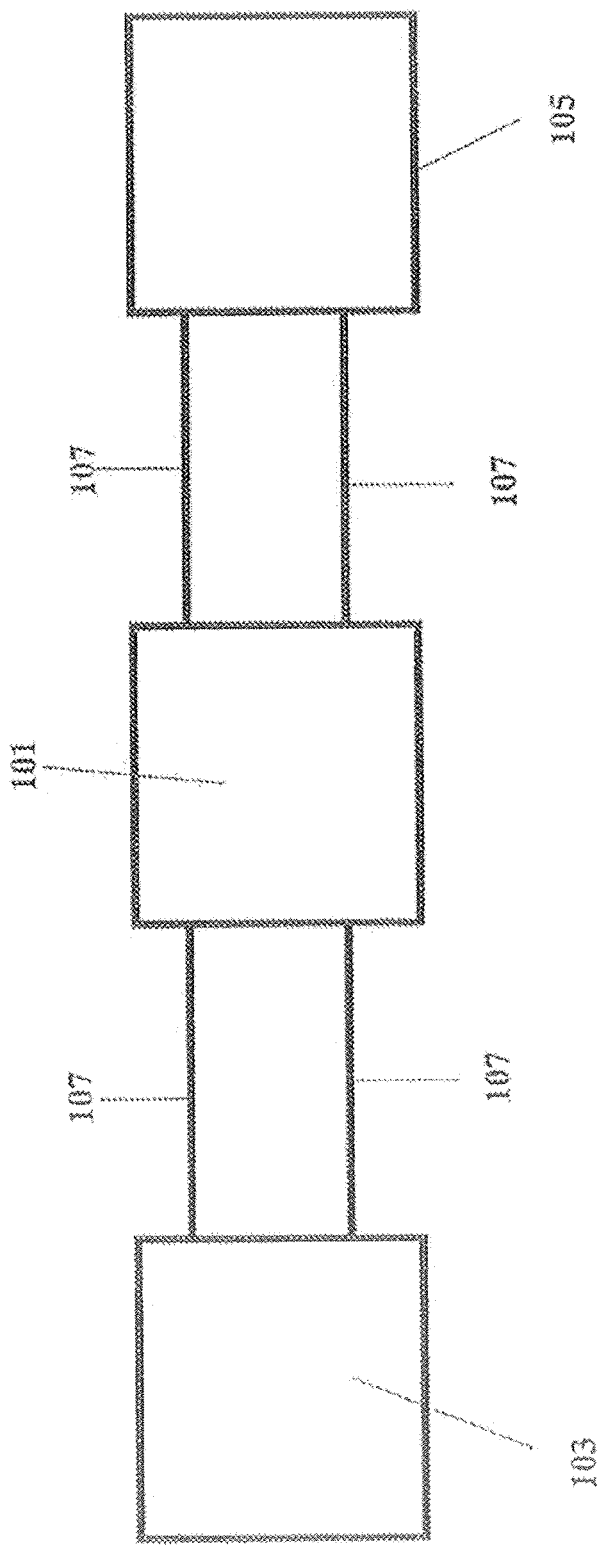
FIG. 1 shows a schematic block diagram of a power management module.
Figure 2:
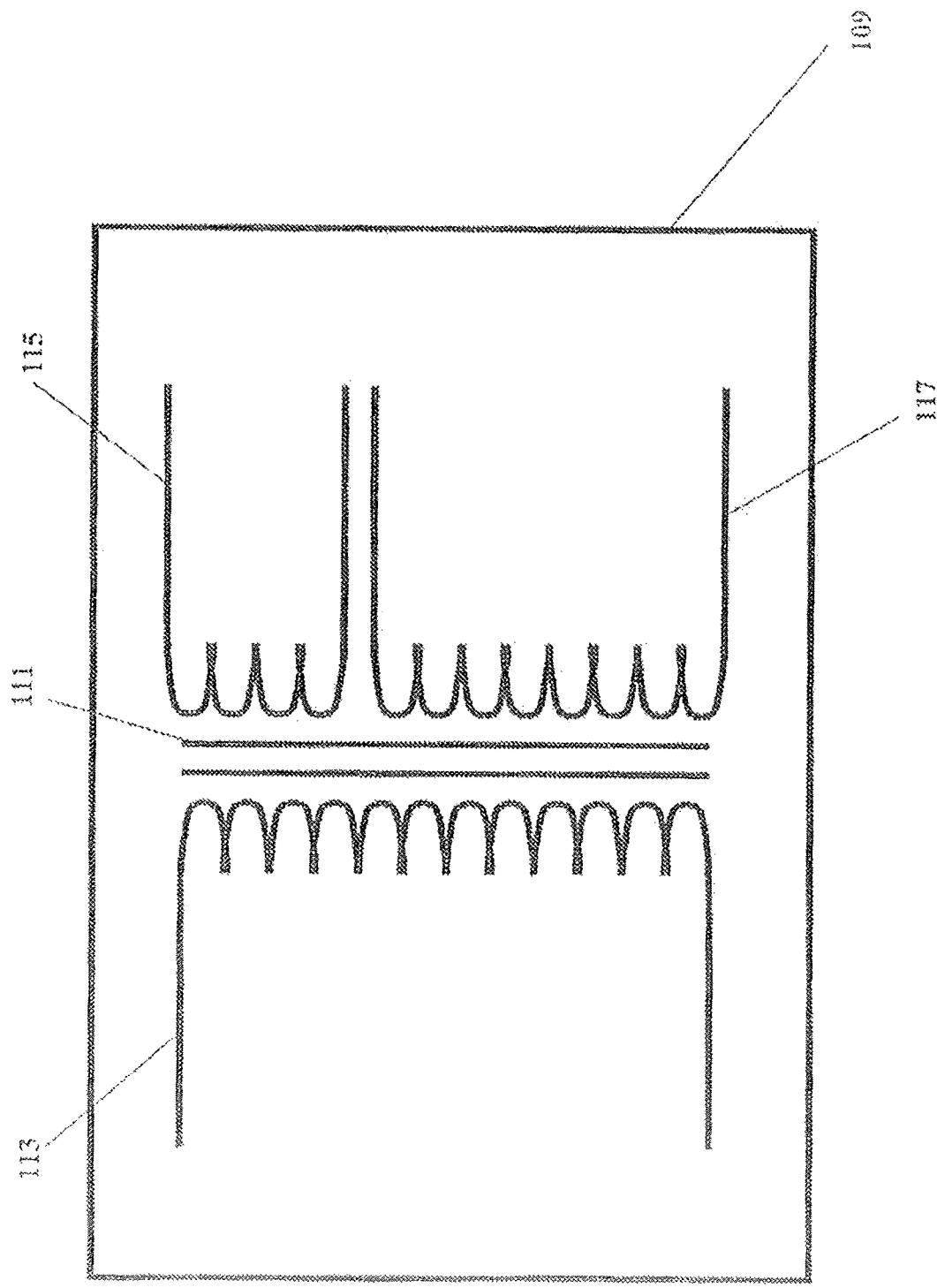
FIG. 2 shows a schematic of a typical representative transformer.
Figure 3:
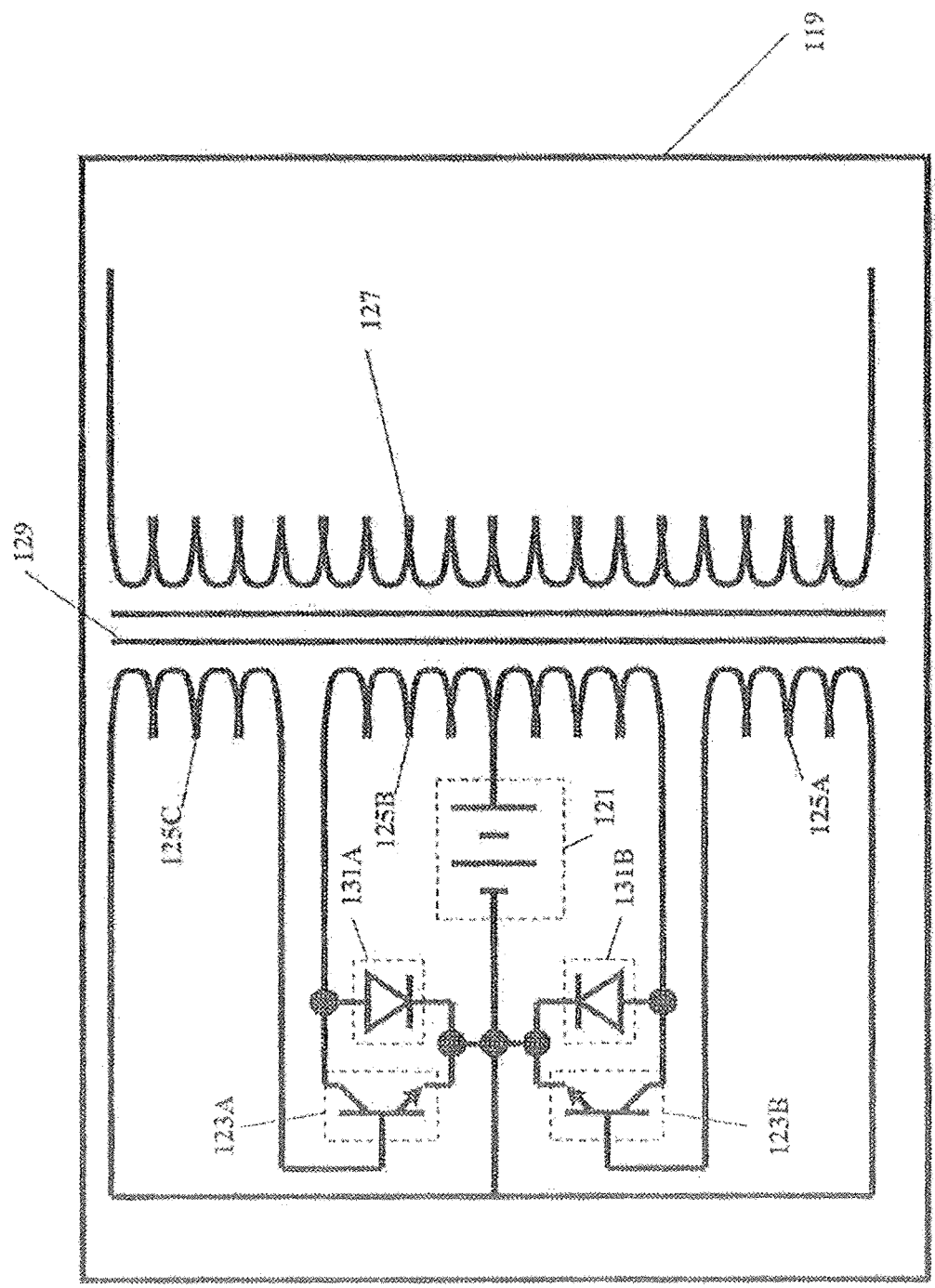
FIG. 3 shows a schematic representative of an AC-to-DC converter.
Figure 4A:
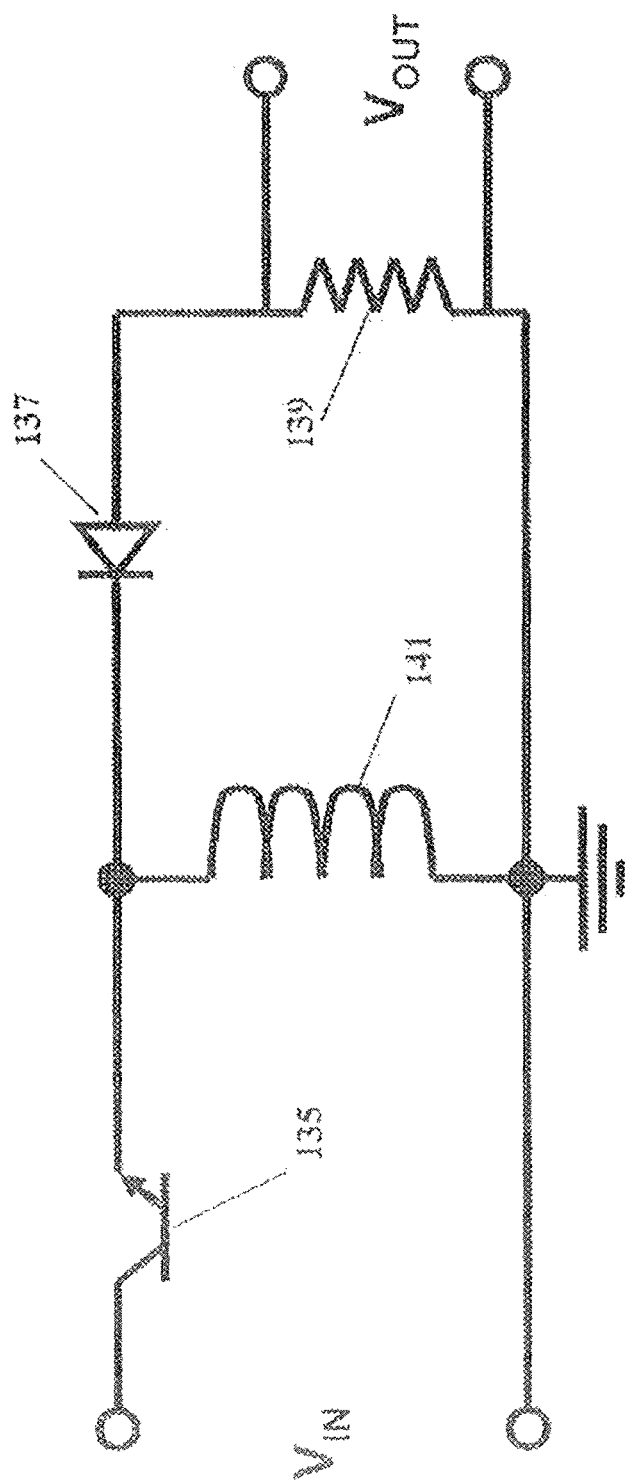
Figure 4C:
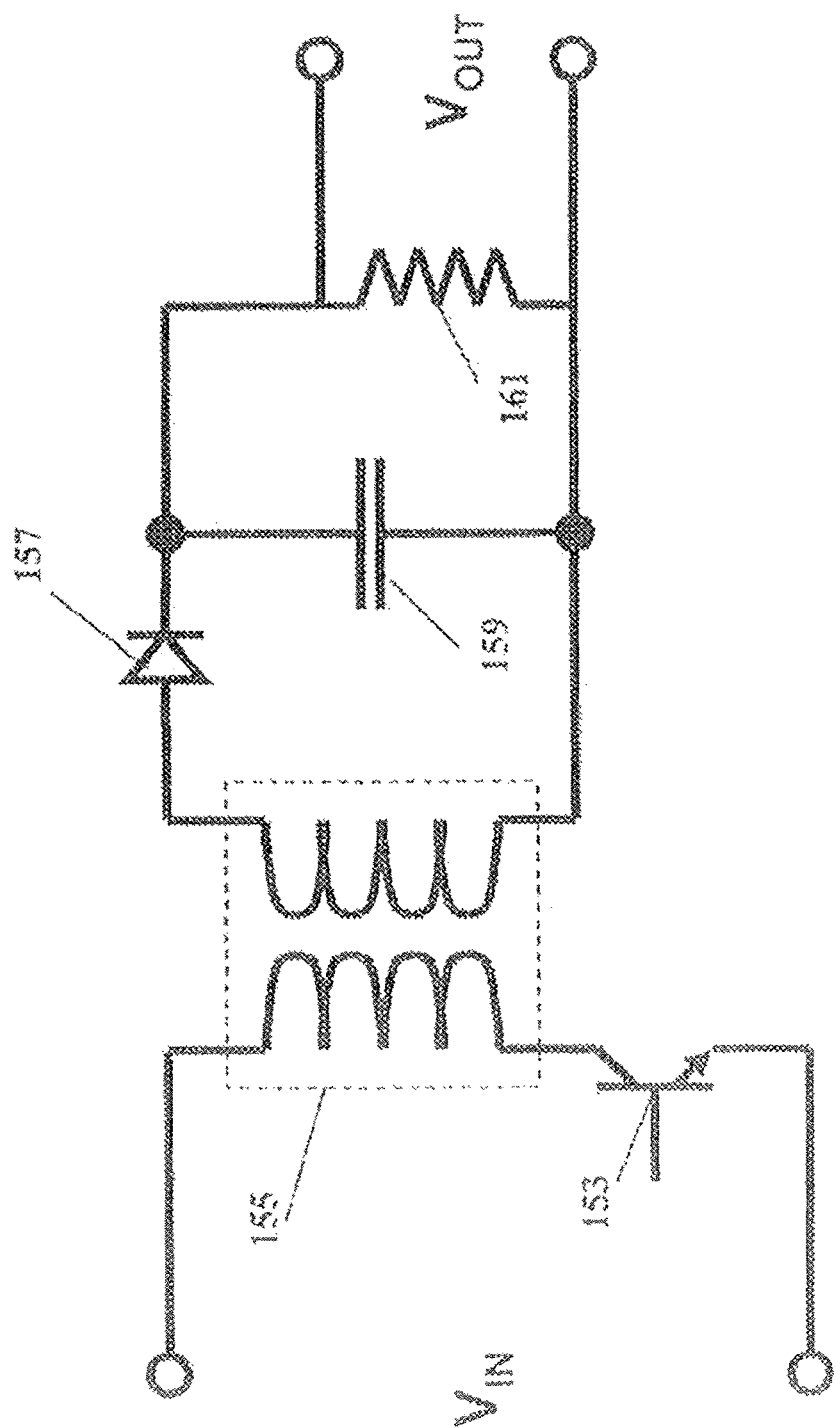
Figure 4D:
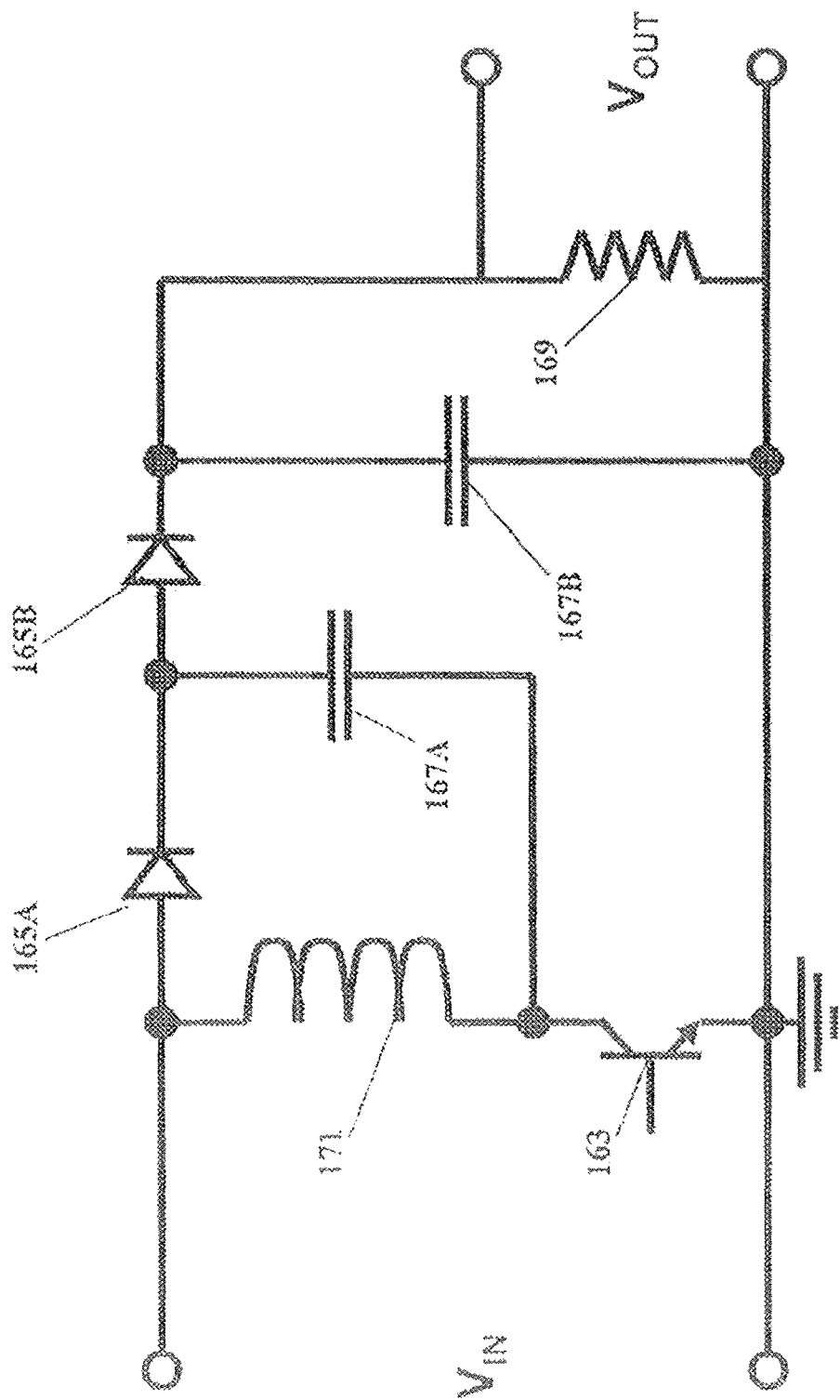
Figure 5A:
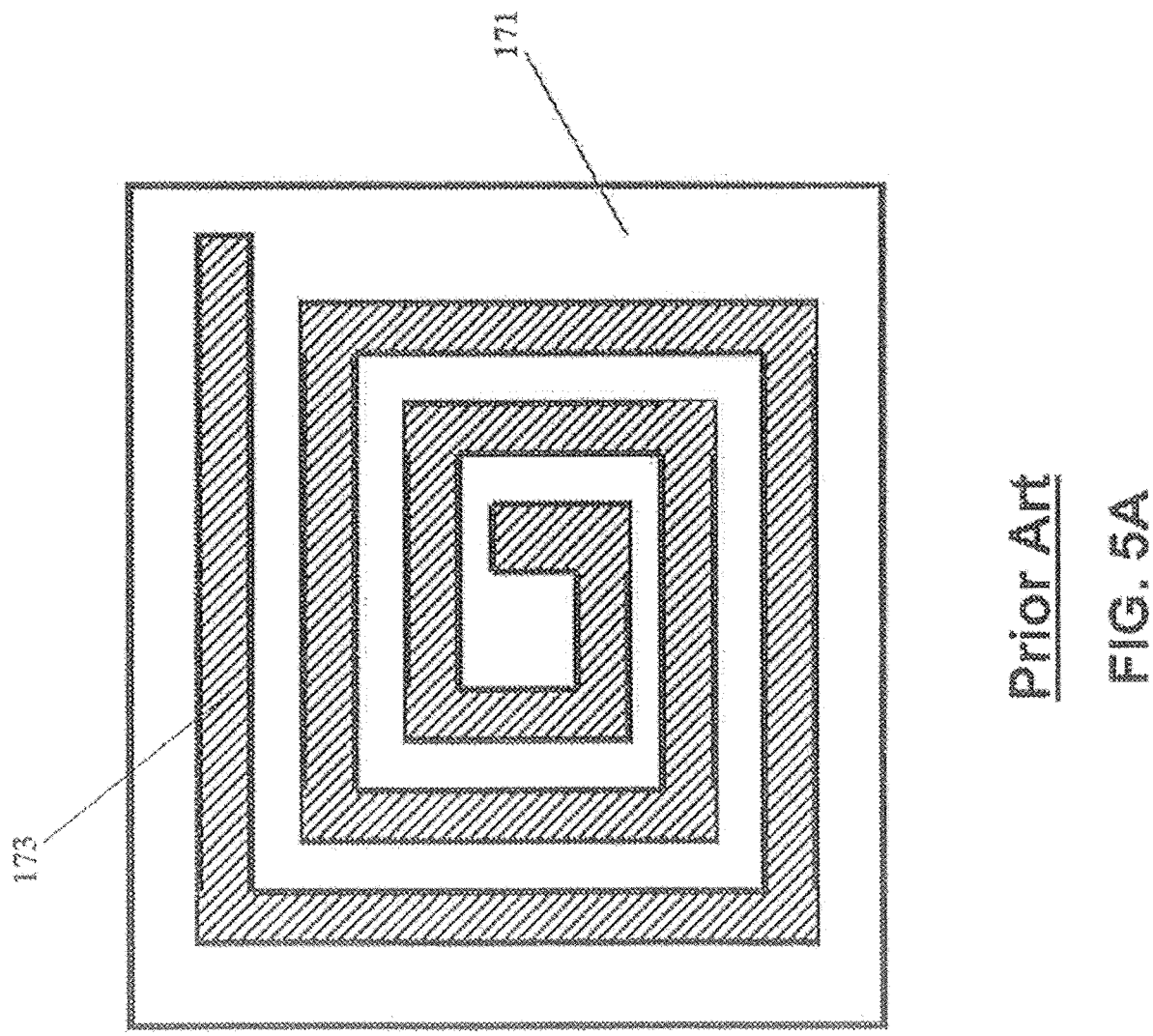
FIGS. 5A, 5B show top and partial perspective views, respectively, of spiral inductors that are typically used to integrate inductors in a solid state power management module by the prior art.
Figure 5B:
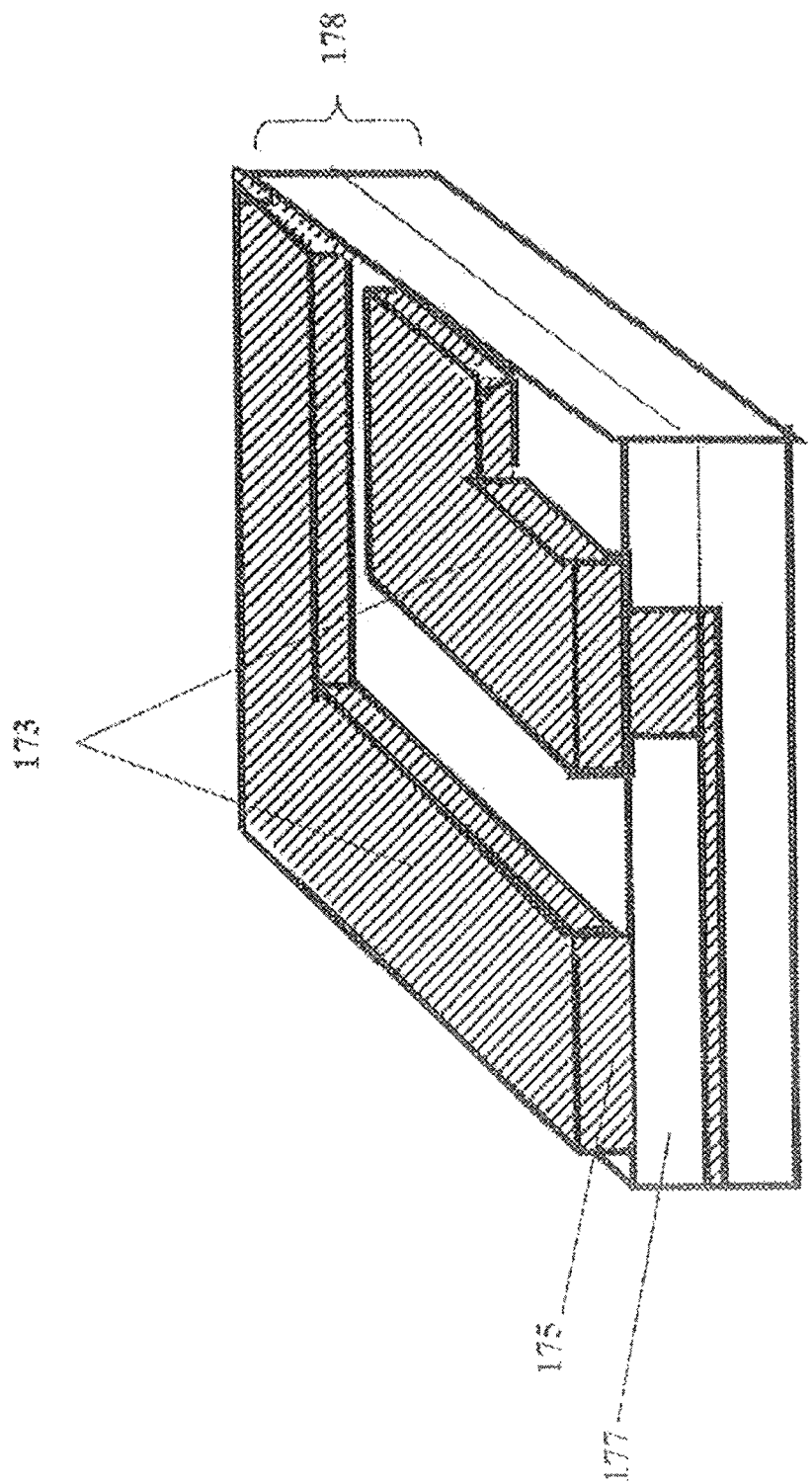

Reduced cost, smaller size, and increased power densities are key quality characteristics of power management modules. Methods and articles that provide means to improve component integration, improve performance tolerances over standard operating temperatures, and reduce the form factor (size or footprint) of a power management module therefore represent specific. All power management devices contain at least one or more inductive components used either as an inductor or a transformer. Power management devices may optionally include resistor components and capacitor components, but will generally include one or more semiconductor transistor devices that function as a switching element or a rectifying component. In reference to FIGS. 5A, 5B, it is common practice to integrate the inductor component within a solid state module by fabricating a spiral coil 173 within a metallization layer 175. This is applied to a dielectric substrate 177 that is subsequently integrated into a multilayer assembly 178. Multilayer assembly 178 electrically connects spiral coil 173 to the other components used to fabricate the circuit. While this approach provides a mean to fabricate a low cost inductor, the footprint of the spiral inductor limits the ultimate form factor.

U.S. patent application Ser. No. 11/479,159, describes methods to embed passive components (resistors, inductors, and capacitors) within a multilayer assembly to form an integrated interconnect circuit that can be placed in electrical communication with a semiconductor device or other component to form a fully integrated circuit module. Liquid chemical deposition (LCD) uses liquid aerosol sprays to blanket coat ceramic dielectric composition upon a base substrate and inkjet techniques to deposit a plurality of high-quality ceramics locally with atomic-scale chemical uniformities. Modest deposition temperatures in the range of 250.degree. C. to 500.degree. C., preferably in the range of 350.degree. C. to 430.degree. C., cause the initial ceramic deposits to form as amorphous solid state solutions with no discernible crystalline structure. Subsequent rapid thermal annealing techniques are then applied to evolve crystalline phases with strict controls over the ceramic microstructure (grain size and texture), providing means to produce chemically uniform ceramic with uniform grain-size, i.e., 100% of all grains will have a diameter that is less than or equal to 1.5.times. the mean grain diameter. Because these ceramics are synthesized from amorphous solid solutions with atomic scale chemical uniformity, mean grain sizes can be controlled to have physical dimensions ranging from 10 nanometers (nm) to 100 or more microns to optimize electroceramic performance tolerances for specific applications. For instance, ferroelectric electroceramics compositions that typically have high values of dielectric permittivity (.di-elect cons..sub.R>100) will maintain their paraelectric phase and exhibit stable dielectric property values and performance tolerances within .+-.1% over standard operating temperatures when ceramic grains have physical dimensions in the range of 35-50 nm. These electroceramics are highly useful as embedded capacitors in precisely tuned circuits. Conversely, the relative permeability (.mu..sub.R) of a ferromagnetic or anti-ferromagnetic ceramic is maximized when its grain size is allowed to evolve beyond 5-10 microns. High values of relative permeability are desirable in ferromagnetic ceramics applied as the inductor core of solenoid and transformer devices. A principal benefit of LCD ceramic processing is that it allows high-precision electroceramic structures to be engineered in three-dimensions to form components useful to the miniaturization of integrated passive components fabricated to high performance tolerances. An additional benefit is that LCD ceramic processing allows chemically complex ceramic materials such as garnets, which are extremely useful in RF frequency (800 MHz to 2 GHz) inductor and transformer applications to be incorporated into these precision engineered 3-D structures.

Figure 6A:
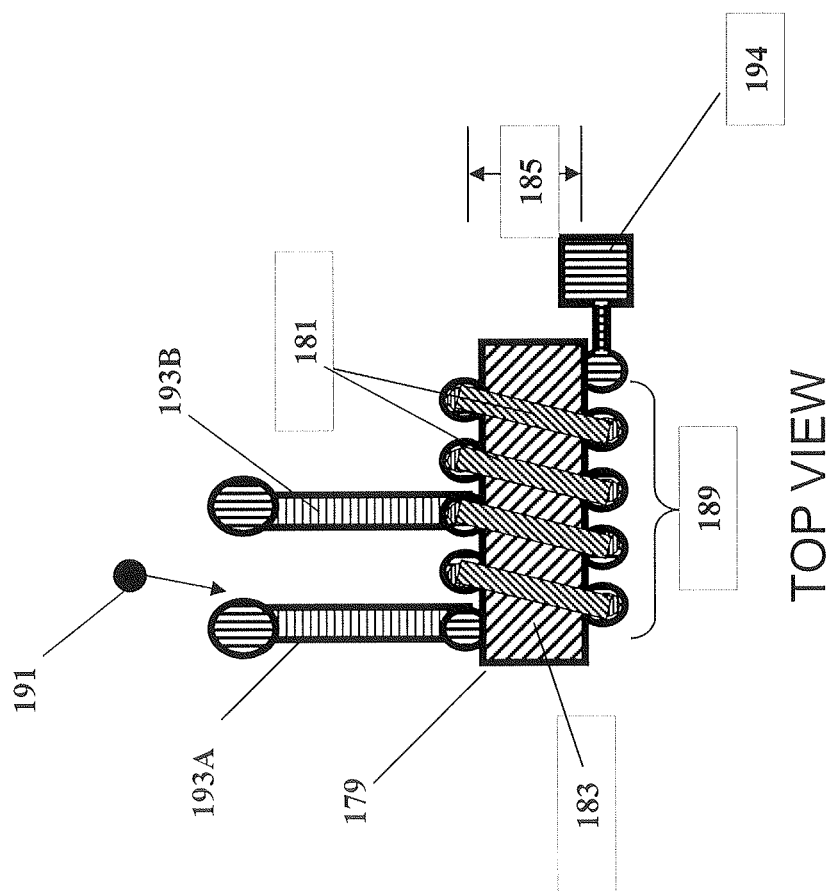
FIGS. 6A, 6B show top and side views, respectively, of an LCD ceramic solenoid inductor.
Figure 6B:
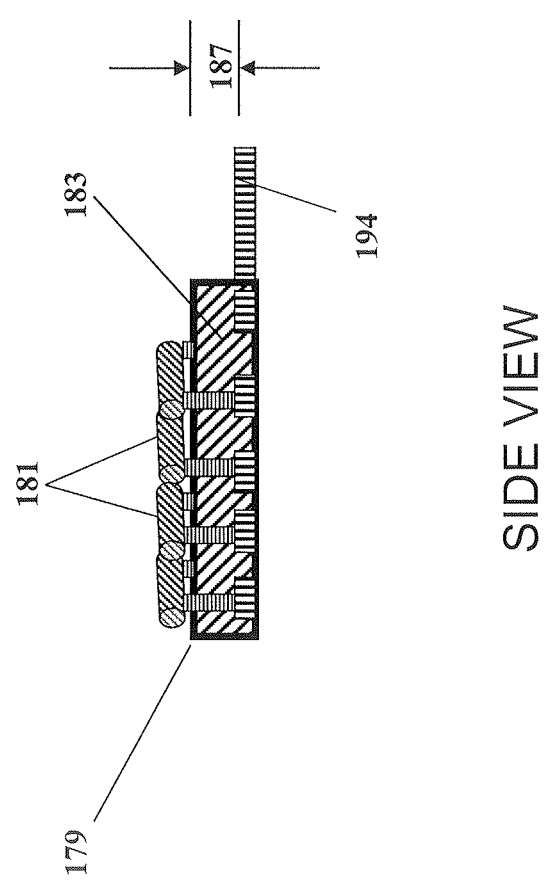

Reference is now made to FIGS. 6A, 6B which depict a LCD solenoid inductor 179 that comprises a conductor coil 181 wound around an LCD-processed ferromagnetic inductor core 183. Inductors are a principal component of all power management modules. The inductance, L, of an LCD ceramic solenoid inductor is determined by:

i. $L = N^2 \mu_o \mu_R W h / 1$, (2)

where, L is the inductance in units of Henry's, $\mu_o$ equals $1.26 \times 10^{-7}$ H m$^{-1}$, $\mu_R$ is the relative permeability of the ceramic inductor core 183, N is the number of windings in the conductor coil, W is the width 185 of the winding in the conductor coil, h is the height 187 of the conductor coil, and l is the length 189 of the conductor coil. Typical values for the relative permeability $\mu_R$ of ferromagnetic ferrite ceramics can range up to $\mu_R=10,000$ near DC frequencies, while ferromagnetic garnets can provide $\mu_R=300$ at RF frequencies. Therefore, an LCD ceramic solenoid inductor constructed to have 3 windings, a coil length 189 of 0.35 mm, a winding width 185 of 3 mm, and a coil winding height of 350 microns (0.35 mm) will occupy a footprint roughly 1 mm$^2$ and provide DC inductance of approximately 34,000 nH and a RF inductance of approximately 1,000 nH when the ceramic inductor core has a relative permeability $\mu_R$ equal to 10,000 and 300, respectively. This compares favorably to a 7 turn spiral coil packed into 1 mm$^2$ footprint using a conductor width of 50 microns and conductor spacing of 15 micron, which would generate an inductance of only 20-26 nH. These examples provide 1,700-fold increase in DC inductance values per mm$^2$ using LCD ceramic solenoids over spiral inductors, and an approximately 50-fold increase in RP inductance using LCD ceramic solenoids over spiral inductors, demonstrating clearly the means to increase power densities while reducing the size and cost of the power management module, which represents a considerable increase in the key quality parameter of a primary component of power management devices. If desired, the inductance of the LCD ceramic solenoid can be varied by applying a system of switches 191 that alter the conductive traces 193A, 193B in electrical communication with individual windings and used as the input feed so as to cause the effective number of windings in the coil between the feed points 193A, 193B and the coil output pad 194 to be increased or decreased depending upon the switching state, thereby producing a corresponding change in the value of solenoid's inductance.

Figure 7:
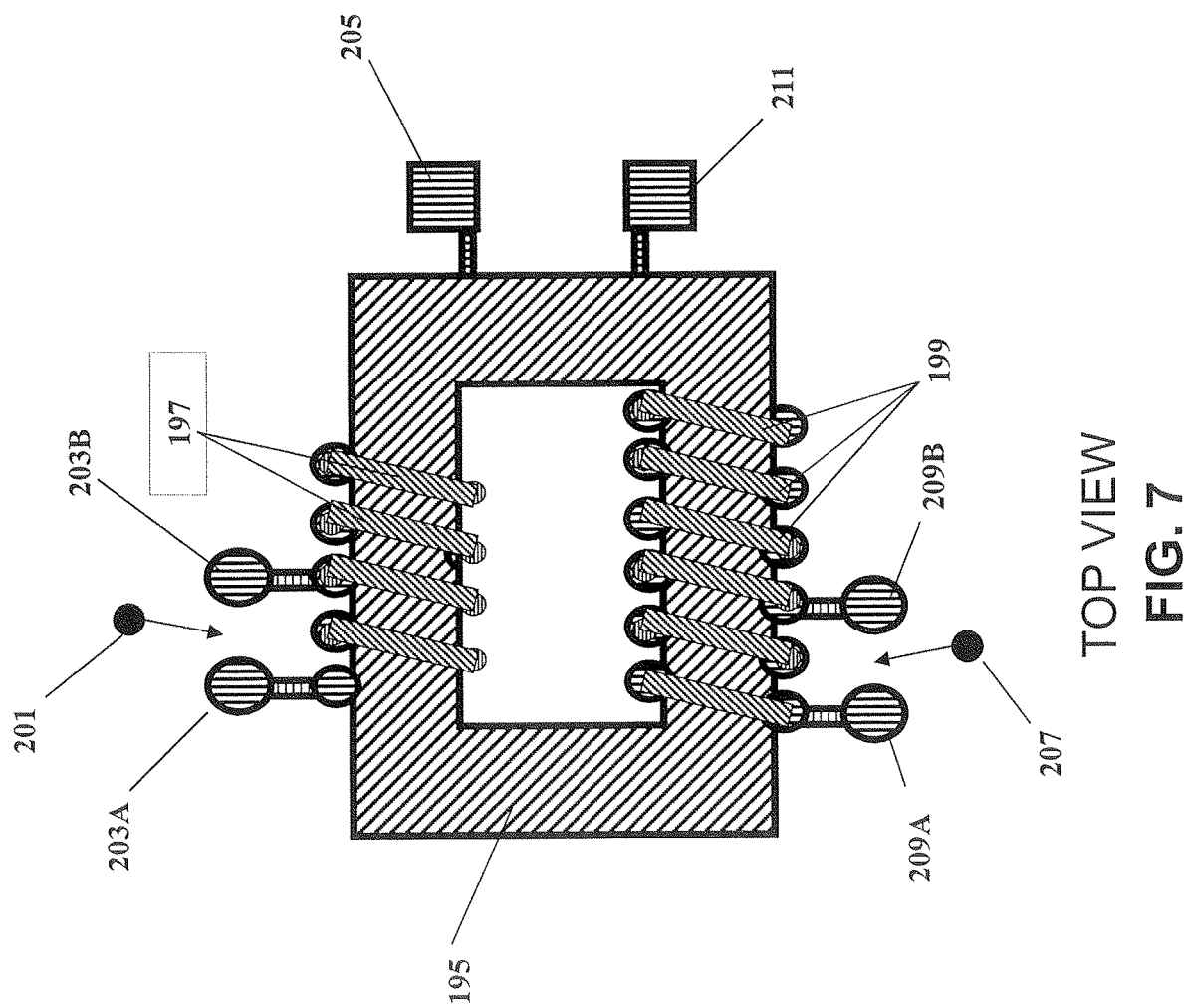
FIG. 7 shows a top view of one configuration for an LCD ceramic solenoid transformer.
Figure 8A:
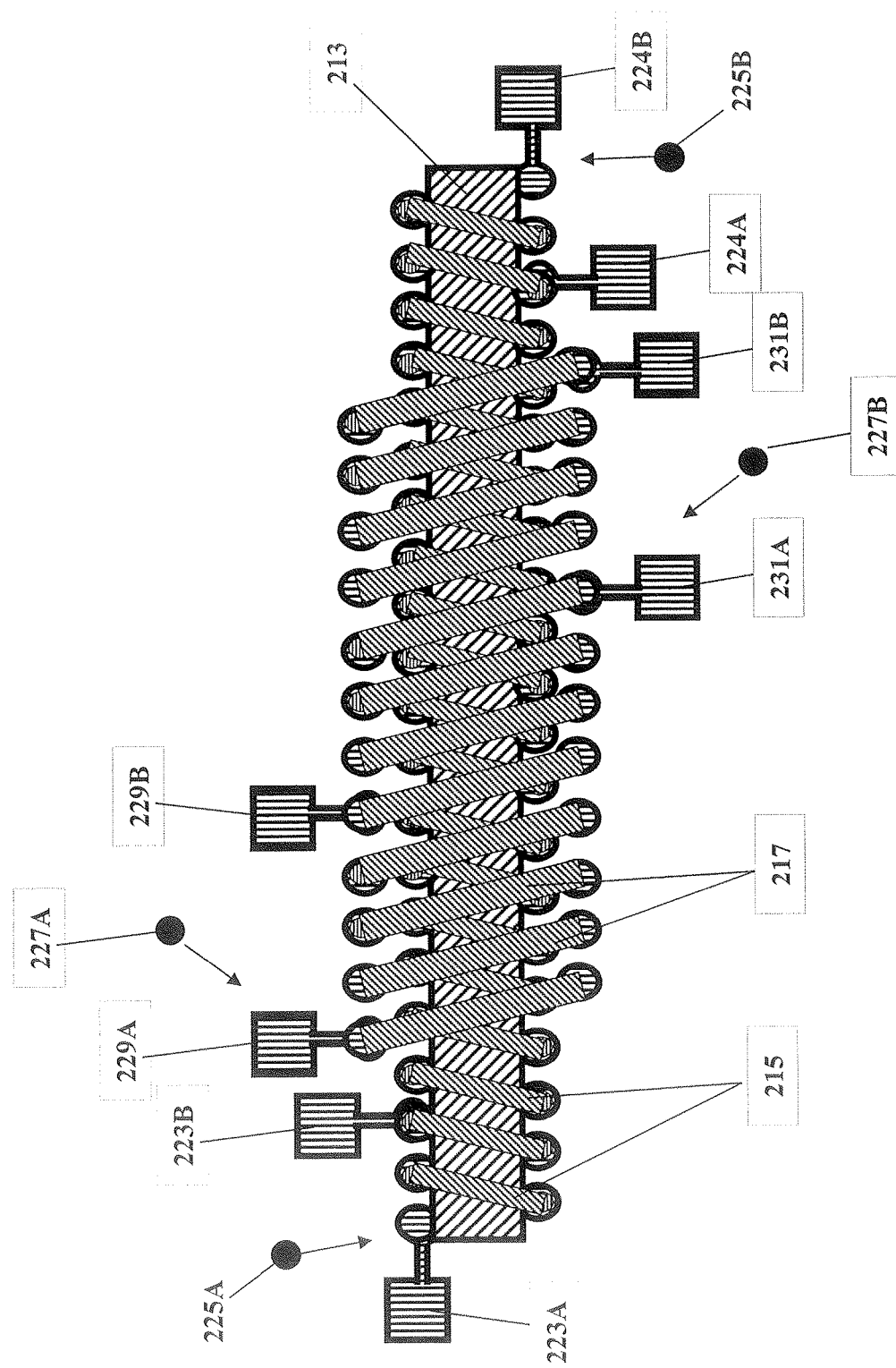
FIGS. 8A, 8B show top and end views of an alternative configuration of LCD ceramic solenoid transformer.
Figure 8B:
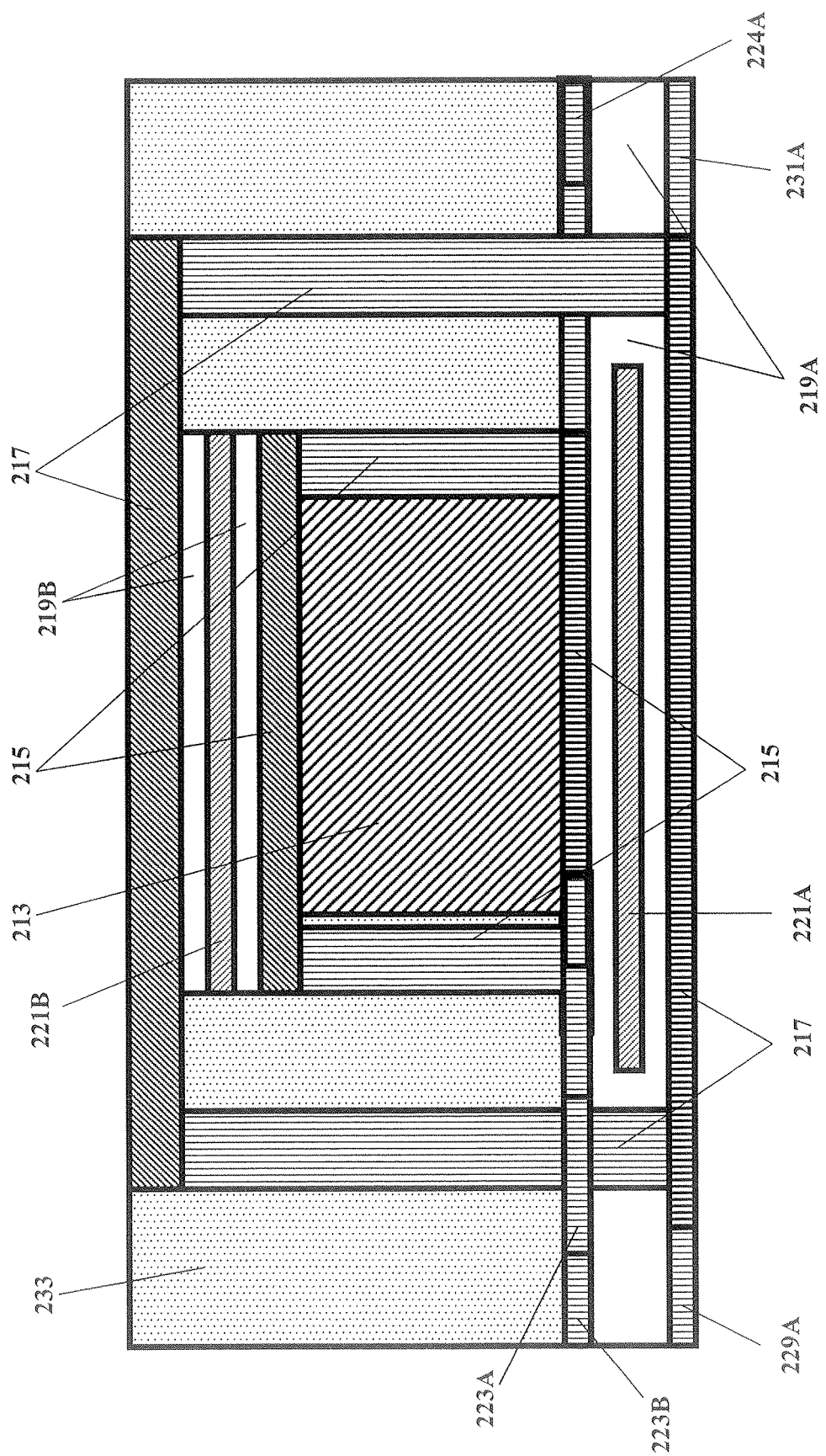

Certain power management modules contain transformers. Reference is now made to FIGS. 7 and 8A,8B to detail transformer configurations for LCD solenoid inductors. Each transformer embodiment comprises at least two (2) coils with electrically isolated inputs and outputs that are wound around the same inductor core. In one configuration, (FIGS. 7A,7B) inductor core 195 formed from high permeability ($\mu_R \neq 1$) is configured in a closed toroidal loop. At least one input coil 197 is wound around one segment of the looped inductor core 195 and induces a magnetic current within the inductor core 195 that, in-turn, induces a response in at least one output coil 199. The inductance of the at least one input coil 197 can be modulated using a system of switches 201 that causes the effective number of windings between the feed points 203A, 203B and the input coil reference pad 205 to be altered, producing a corresponding change in transformer input inductance. Similarly, the inductance of the at least one output coil 199 can be modulated using a secondary system of switches 207 that causes the effective number of windings between the output coil feed pads 209A, 209B and an output coil reference pad 211 to be modulated to provide additional controls to tune or adjust transformer performance.

The alternative configuration of FIGS. 8A,8B provides a reduced transformer footprint utilizing a single segment inductor core 213 around which both an at least one input coil 215 and an at least one output coil 217 are wound. Input coil 215 and output coil 217 are electrically isolated by an insulating ceramic dielectric 219A, 219B, preferably a low loss silica-based dielectric, and, optionally, by an electrostatic shield 221A, 221B, comprising an electrically conductive metal or ceramic, such as indium-tin oxide, to prevent capacitive coupling between the coils. (The insulating ceramic 219 and electrostatic shield is omitted from the TOP perspective in FIG. 8A for the purpose of graphical clarity). In this alternative configuration, one coil is wound within the other. Although FIGS. 8A, 8B depict input coil 215 as the inner coil, the choice as to which coil is the inner coil is variable. Electrical connection to input coil 215 is made with a plurality of feed traces 223A, 223B and a plurality of reference traces 224A, 22413 that tap into input coil 215 windings at the ends of the linear assembly. The inductance of the input coil 215 is modulated using a system of switches 225A, 225B that alter the relative location of the feed points and reference taps for those windings that extend beyond the physical dimensions of the outer coil, thereby causing the effective number of windings in input coil 215 to be altered. The inductance value of the outer coil (shown as the output coil 217 in FIGS. 8A,8B), can have its inductance modulated using a system of switches 227A, 22713 that causes the effective number of windings between the output coil feed pads 229A, 229B and an output coil reference pad 231A, 231B to be modulated to provide additional controls to tune or adjust transformer performance. An encapsulating dielectric 233 is applied to provide electrical isolation from other components and to rigidly hold the assembly in place when the transformer component is subsequently embedded in a passive circuit. The encapsulating dielectric 233 may either comprise LCD ceramic dielectric, preferably amorphous silica ceramic, applied as a blanket-coated dielectric using a liquid aerosol spray, or it may comprise an organic dielectric, preferably a polymer formulation that is commonly used to under-fill flip-chip assemblies. An organic encapsulating dielectric 233 is preferred when the LCD ceramic inductor or transformer is to be embedded within an organic interconnect structure.

Figure 9:
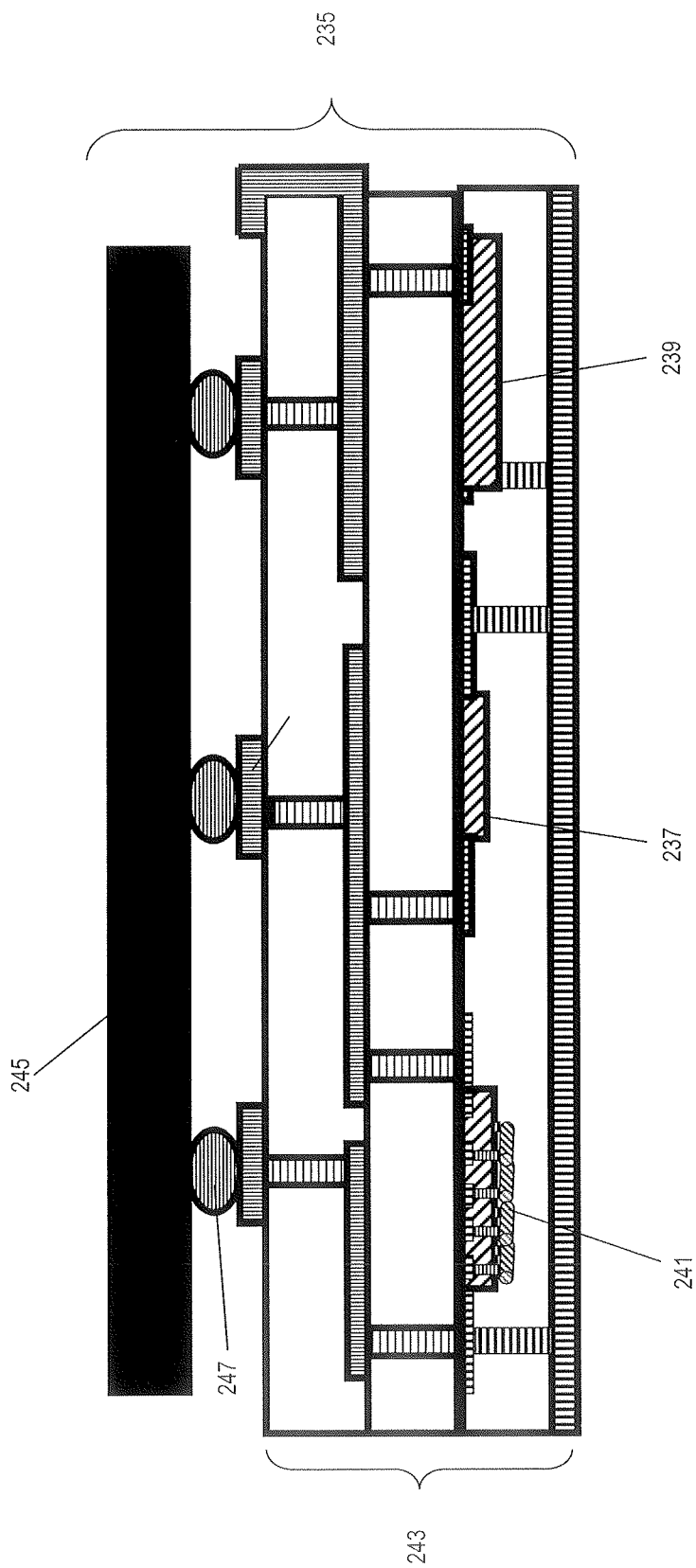
FIG. 9 shows a side schematic view of a power management module fabricated as a system-in-package.
Figure 10:
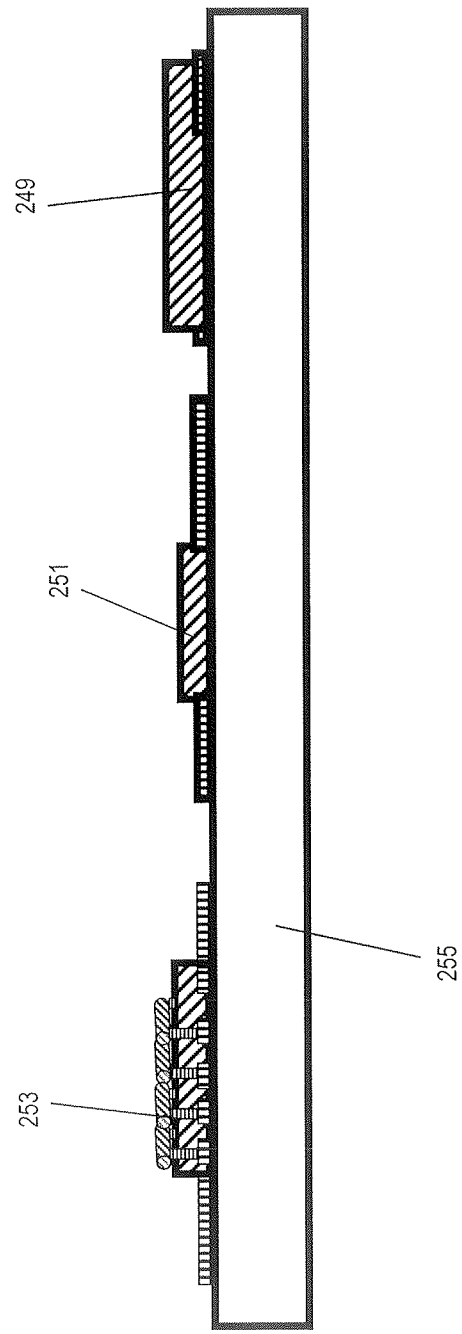
FIG. 10 shows a side schematic view of a power management module fabricated as a system-on-chip.
Figure 11:
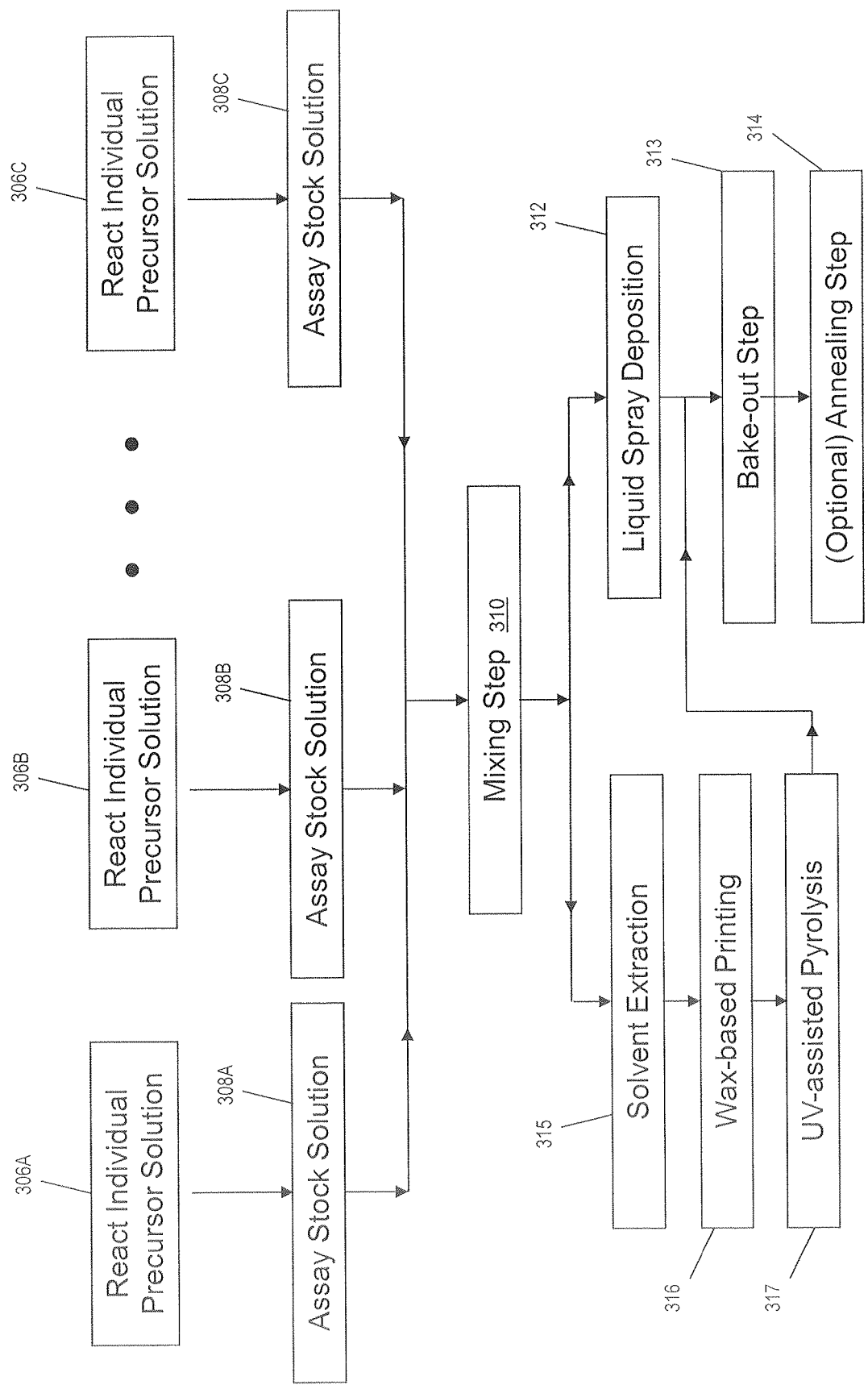
FIG. 11 is a flow chart of a process used for preparing materials used for constructing the present embodiments.

As noted above, inductor and transformer embodiments are electrically connected with other passive components (resistors and optionally capacitors) and active devices (semiconductor transistor switches and rectifying diodes) to complete the power management module. As shown in FIG. 9, the power management module 235 can be assembled as a system-in-package (SIP) device, wherein all of the passive circuit elements (resistors 237, capacitors 239, and inductors/transformers 241) are integrated within one or more layers within a passive interconnect circuit 243 that is subsequently placed in electrical communication through conductive means 247 with at least one semiconductor chip 245 that contains the transistor switches and rectifying diodes. The modest process temperatures used to synthesize LCD ceramic components (250° C. to 500° C., preferably 350° C. to 430° C.) are sufficiently low that they will not disturb dopant profiles in silicon (Si) and silicon-germanium (SiGe) semiconductors, or thin film structures applied to the surface of gallium-arsenide (GaAs) and most other III-V compound semiconductors. This provides a means to achieve further integration by assembling the passive components, resistors 249, capacitors, 251, and inductor/transformers 253, used to complete the power management module directly on the surface of a semiconductor die 255 that contains the active semiconductor switches and rectifying diodes as shown in FIG. 10.

Reference is now made to FIGS. 11-14 to illustrate methods to fabricate electroceramic compositions useful to the design and construction of passive components used to fabricate power management modules using the LCD ceramic process. To achieve this goal, methods are provided to deliver a plurality of LCD precursor materials in selective locations across a single substrate layer, as well as methods to apply a single layer of high-quality electroceramic uniformly across an entire substrate surface. LCD materials fabrication starts with a solution preparation step that consists of reacting the metal precursors with a carboxylic acid solvent, preferably a carboxylic acid of rank 5 or higher, to fours a carboxylic acid salt solution 306A, 306B, ..., 306N for each metal oxide incorporated into the final deposit. A single component solution is used when the objective is to fabricate a single component (one metal oxide), a plurality of single component solutions are prepared when it is desirable to synthesize a mixed metal oxide material. Two carboxylic acid salts, 2-ethylhexanoate and neo-decanoate, are preferred for their superior liquid film forming and efficient pyrolytic decomposition properties. A preferred method to form a carboxylate salt involves driving an exchange reaction between said carboxylic acid with an initial high volatility lower rank metal precursor, such as an acetate salt, through vacuum distillation and filtering. While acetate salts represent a suitable lower rank precursor for use in the LCD process, other lower rank high volatility precursors can be used without restriction. Certain metals or semi-metals, such as titanium or silicon, have a very strong affinity to hydroxyl groups (OH.sup.-), and an ideal chemistry for LCD processing can be permanently destroyed if these compounds are exposed to even minute amounts of oxygen or water vapor. In this instance, it is necessary to react these air/moisture-sensitive compounds in a dry, inert gas atmosphere, such as helium, argon, or dry nitrogen and to package, store, and handle the solutions under glove box conditions. In this instance, the inert gas should be introduced as purge gas into the vacuum distillation column.

The reacted solutions are then assayed to determine a precise molar concentration 308A, 308B, ..., 308N. Inductively-coupled plasma atomic emission spectroscopy (ICP-AES) is the preferred assay method. The assayed solutions are then titrated and thoroughly blended to form a mixed solution 310 that contains a molar stoichiometry known to produce the desired stoichiometry after spray deposition when a multi-component electroceramic is desired. The mixed precursor solution is then filtered once more after blending the plurality of precursors. Solution stoichiometry will differ from the deposit stoichiometry and depend very strongly on specific characteristics of the deposition system. The precursor solution may have to be enriched with certain metal cation concentrations that might be prone to higher loss rates during the deposition process; however, metal cation loss rates are extremely predictable when all process parameters are tightly controlled. Solutions prepared with high rank carboxylate solutions are capable of dissolving high molar concentrations of carboxylic acid salts. Metal densities in solution are more conveniently expressed in terms of their percentage weight of equivalent oxides (wt % equiv. oxide), which allows a quick calculation to determine how much solid oxide material will be created from a given quantity of solution. For instance, 100 gms of a solution that has an 10% wt % equiv. oxide, will produce 10 gms of metal oxide material after the entire quantity of material has been deposited. In general, it is advisable to prepare solutions to have wt % equiv. oxide ranging from 0.001% to 25%, preferably 0.1% to 20%. Dilute solutions (0.001% to 1% wt % equiv. oxide, are preferred when making thin film materials (<1 micron thickness) using liquid aerosol spray deposition. More concentrated solutions, 1% to 25% wt % equiv. oxide, are preferred when fabricating precursor waxes, thick films (1 micron .ltoreq. deposit thickness <1 mm), or bulk materials (thickness .gtoreq.1 mm). The prepared solution may then be deposited on a substrate heated to temperatures between 200.degree. C. and 500.degree. C., preferably 250.degree. C. and 430.degree. C., using a liquid aerosol spray 312 for curtain coating processes, or for blanket coating processes when it is intended to completely cover the substrate surface area. The deposition is then followed by a bake out step 313 at temperatures ranging between 300.degree. C. and 600.degree. C., preferably 350.degree. C. and 450.degree. C., to remove any residual organic material remaining in the deposit after the deposition process. Controlled gas atmospheres comprising dry air, an inert gas, such as nitrogen, helium, argon, or others, with or without partial pressure redox gases, such as oxygen, or mixtures of carbon monoxide and carbon dioxide may also be applied during the bake out process to accelerate the removal or residual organic compounds. The bake out step 313 may also comprise a rapid thermal annealing step. Most often, the deposited material remains as a solid solution with no visible crystallization after the hake out step 313. It is usually desirable to render the deposited material into an advanced state of crystallization with a precisely controlled microstructure therefore an optional annealing step 314, preferably a rapid thermal annealing step, is applied. Focused pulsed laser light, using a wavelength that is absorbed by the medium, is a preferred process to be used in the rapid thermal annealing step because it allows a very high degree of control over the energy/power delivered to the deposit during the optional annealing step 314. It is advantageous to use the pulsed laser light annealing in conjunction with other thermal controls described above.

Figure 12A:
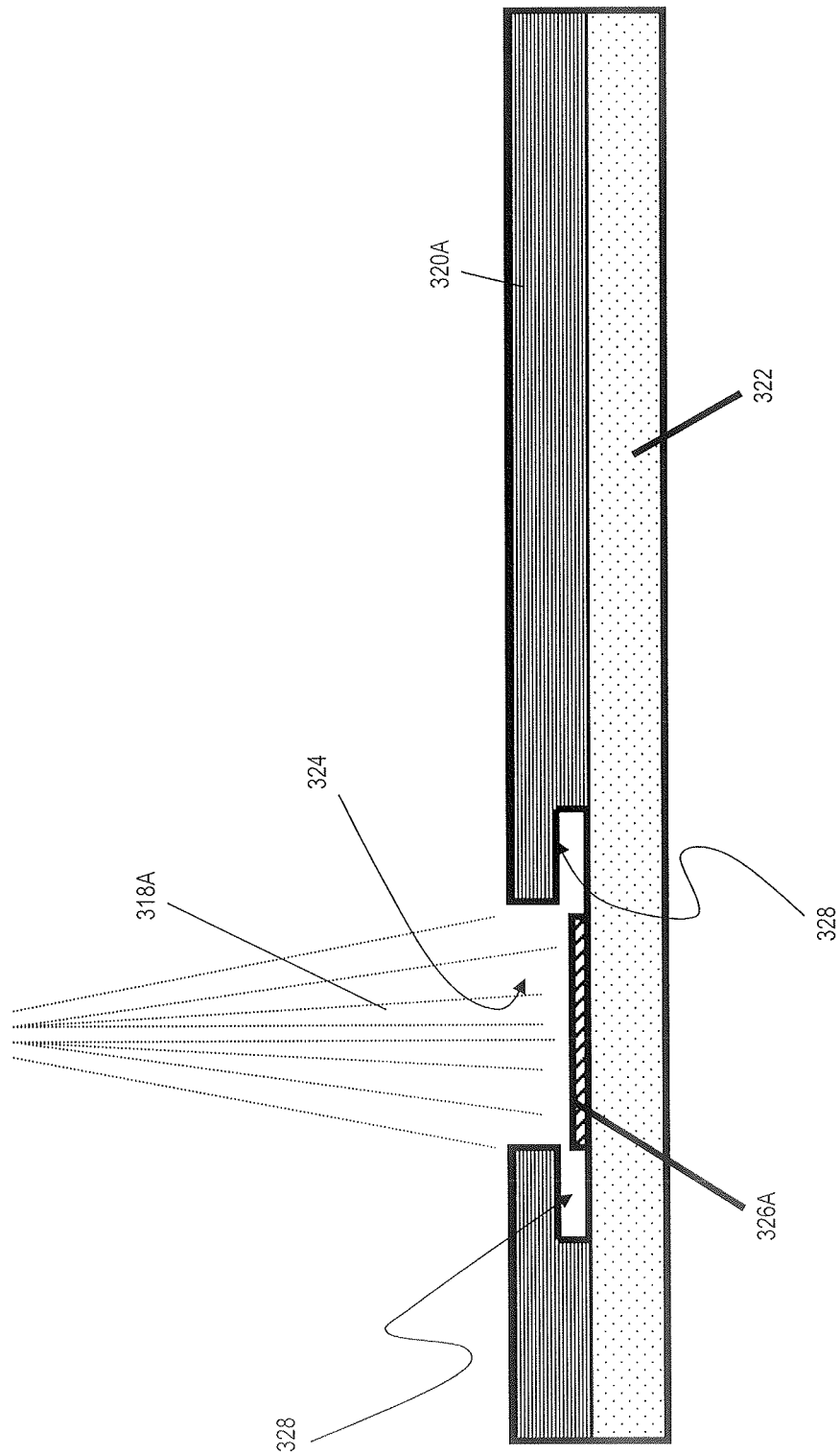
FIGS. 12A and 12B are schematic side views of a process step used for constructing the present embodiments.
Figure 12B:
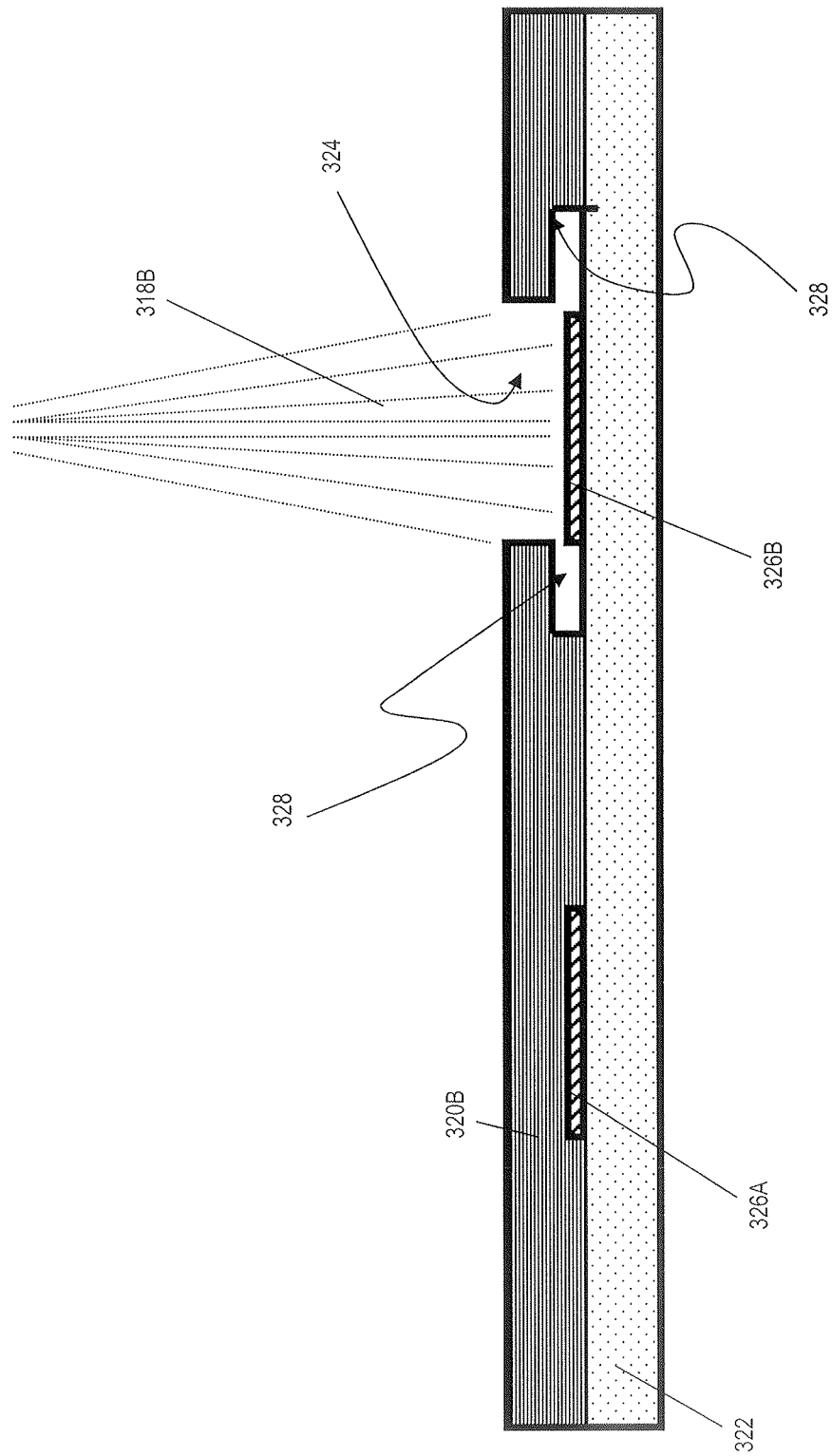

A low cost technique to disperse a variety of ceramic compositions useful as passive components in selective locations over a single sheet or layer is preferred. A low cost technique to disperse a variety of ceramic compositions in selective locations over a single sheet or layer at room temperature or temperatures below 250.degree. C. is also preferred. As a solution process, LCD technology is amenable to direct-write processing, which allows multiple material compositions to be applied locally on a single layer. While inkjet deposition systems would be a likely choice for this objective, a solid-solution deposit is preferred to realize the microstructure controls that achieve the best tolerances. As noted above, the solid-solution is formed when all liquid precursors are decomposed simultaneously. A multi-component precursor solution applied to the substrate at low temperature that is subsequently ramped through all precursor decomposition temperatures would initiate the sequential decomposition of multiple precursors. Sequential decomposition favors all the individual metal oxides to segregate from the solution as nano-nucleates that remain dispersed throughout the deposited material, which is disadvantageous to microstructure control. Applying the solutions to a substrate heated to temperatures sufficient to initiate the simultaneous decomposition of all metalorganic precursors preserves the molecular-level mixing achieved in the liquid solution. The boiling solvent and decomposition products generated with the simultaneous decomposition produces a "steam" of waste products to emanate from the deposit. This is disadvantageous to inkjet deposition systems as the steaming waste products will contaminate the printing heads. As shown in FIGS. 12A, 12B, localized deposition of multiple solutions can be achieved by applying a first liquid aerosol spray 318A of one particular precursor solution through a perforation 324 in a first solid mask 320A that is located above the heated substrate 322. This allows a first ceramic composition 326A to form on the substrate 322 in a select location. A second ceramic composition 326B (FIG. 12B) can then be formed in a second location by applying a second liquid aerosol spray 318B through a perforation in a second solid mask 320B. The solid masks 320A, 320B should have recesses 328 in the vicinity of the perforations 324 that prevent the solid masks 320A, 320B from pulling off the deposited ceramic compositions 326A, 326B when they are removed from the surface of the substrate 322. This method can be used to provide a plurality of ceramic compositions that have properties useful as resistors, capacitors, or inductors, or to provide ceramic compositions that might provide differing performance values for a set of resistor components, or a set of capacitor components or a set of inductor components at selective locations on the substrate's surface.

Figure 13:
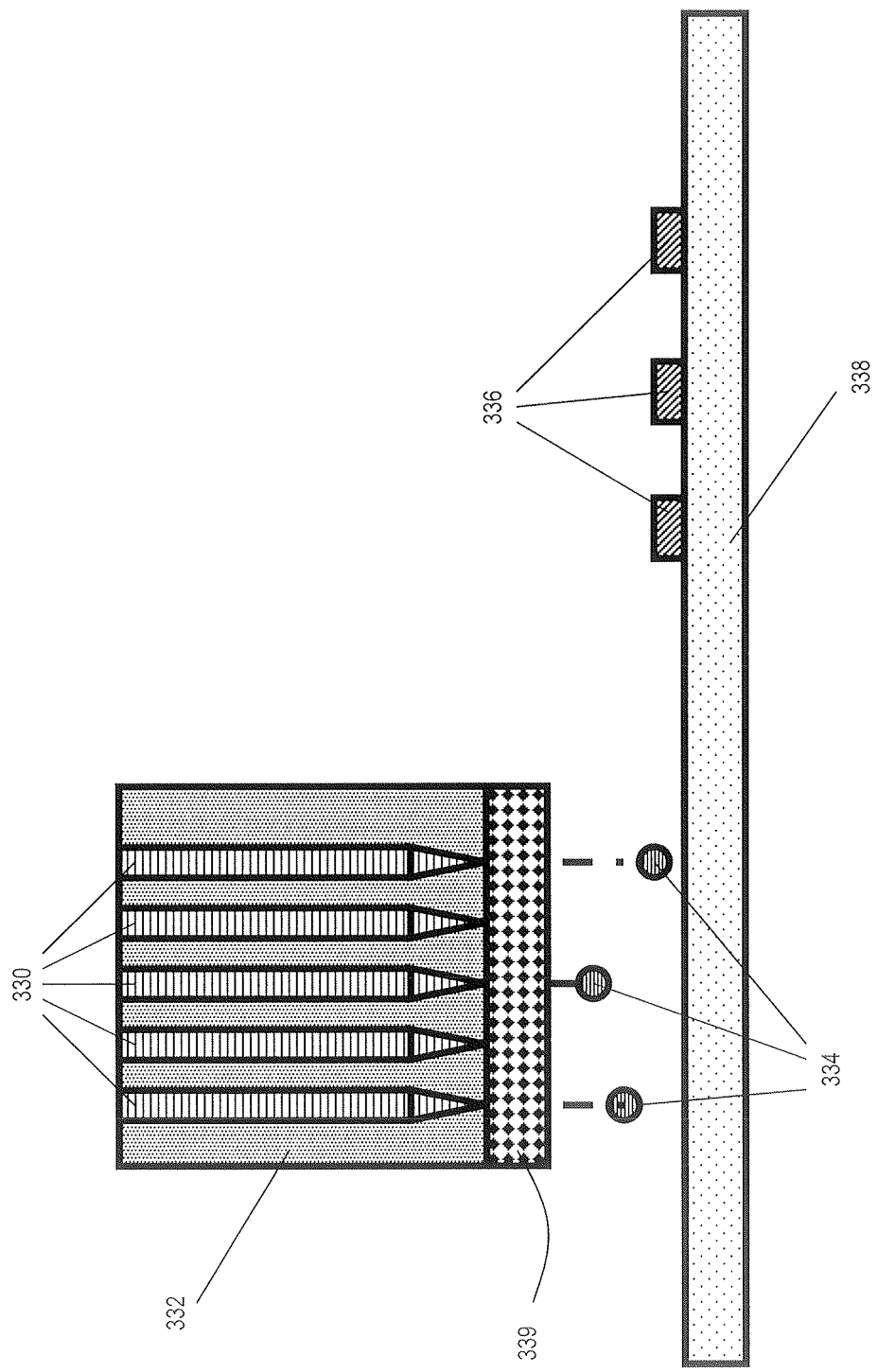
FIG. 13 is a schematic side view of another process step use for constructing the present embodiments.
Figure 14B:
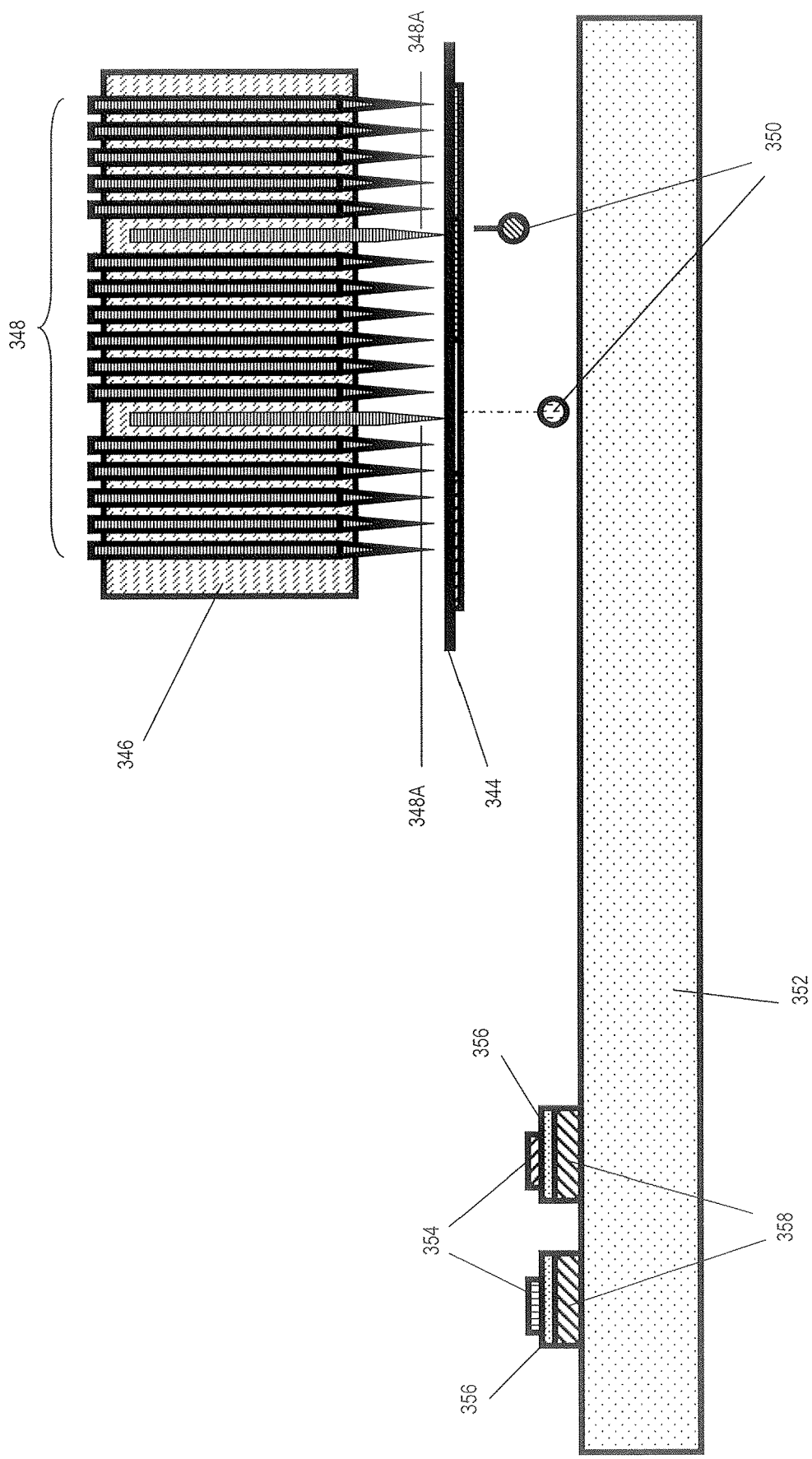

Another specific embodiment of the invention includes methods to locate a plurality of ceramic compositions at selective locations on the substrate surface at lower deposition temperatures. In this instance, the solvent is completely removed from mixed solution 310 using a solvent extraction step 315 (FIG. 11) to render the precursor into a solid wax that can be applied selectively to a substrate surface using a traditional wax printing system 316. Intermolecular forces within the waxy solid phase are strong enough to preserve the level of molecular mixing created in solution that inhibits phase segregation into single species oxides when the waxy solid is subsequently decomposed into the desired metal oxide ceramic. The creation of a solid wax phase precursor allows a number of conventional printing techniques to be used to deposit a plurality of different ceramic compositions on a single surface. FIG. 13 depicts one method that uses a plurality of wax sticks 330, each of which may contain precursors to a distinct ceramic composition, that are locally heated at the printer head 332 to liquefy the end of wax sticks 330 to cause droplets 334 of the precursor wax to solidify into a solid wax deposits 336 at selective locations across the surface of substrate 338 as the print head 332 traverses the substrate. The molten wax droplets 334 emerging from the printer head 332 may also be accelerated and directed by an inkjet processing stage 339.

FIGS. 14A1, 14A2, 14B make reference to an alternative wax printing technique wherein a plurality of wax precursor compositions 340A, 340B, 340C, 340D, etc. are applied to the surface of a tape 342 to form a precursor ribbon 344 with an alternating pattern of wax precursor compositions. One or more precursor ribbons 344 can then be feed off of a spool through a printing head 346 (FIG. 14B) that has an array of fine heated needles 348. Selective needles 348A in the array of needles 348 can be brought into contact with the precursor ribbon 344 as it passes in front of a print head and cause a specific precursor wax to melt into droplets 350 that adhere to a pre-selected location on the substrate 352, where it hardens in place as a solid precursor wax deposit 354.

The simultaneous decomposition of liquid aerosols at a substrate's surface generates a free-radical chemistry that causes the depositing metal oxides to bond aggressively to metal and dielectric surfaces. The decomposition cycle of the wax-based precursor does not share the same level of aggressive free-radical bonding between the metal oxide deposit and the substrate. These deposits show a preference for bonding to oxide surfaces over clean metallic surfaces. In this instance, a thin oxide layer 356 can be applied to the surface of a metallic electrode 358, to which wax precursors 354 will be applied to form an electroceramic. In order to better achieve performance tolerances and thermal stability .ltoreq..+−.5%, preferably .ltoreq..+−.1%, it is preferable to avoid the sequential decomposition of wax precursors that may cause agglomerations of single species oxides that disrupt fine microstructure controls. To maximize decomposition rates of the solid precursor wax deposits 354 an ultraviolet-assisted (UV-assisted) pyrolysis step 317 (FIG. 11), preferably a UV-assisted rapid thermal annealing pyrolysis step using focused energy in the form of microwave, infrared, or ultraviolet radiation, is applied to accelerate the initial decomposition of printed wax precursors into a solid solution of metal oxides. The UV-assisted pyrolysis step 317 is then followed by bake out step 313, and optional annealing step 314.

Figure 15A:
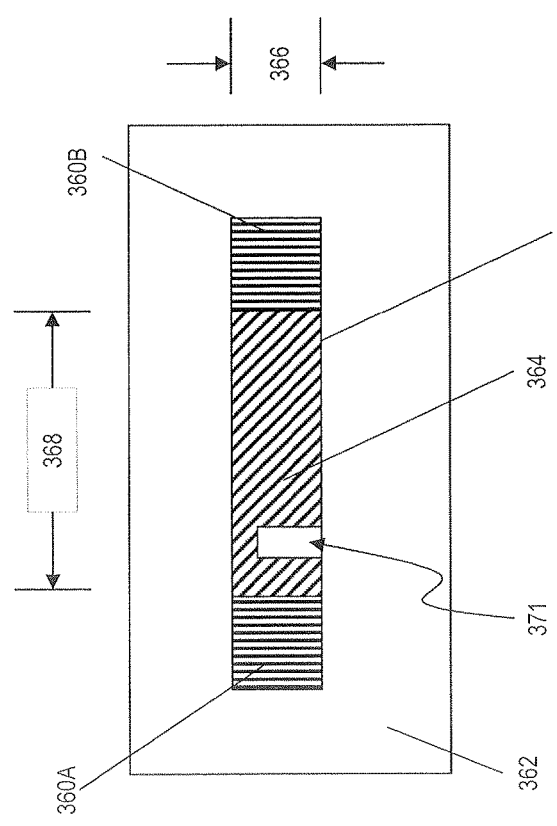
FIGS. 15A and 15B are schematic top and side views, respectively, of process steps used for constructing a resistor for the present embodiments.
Figure 15B:
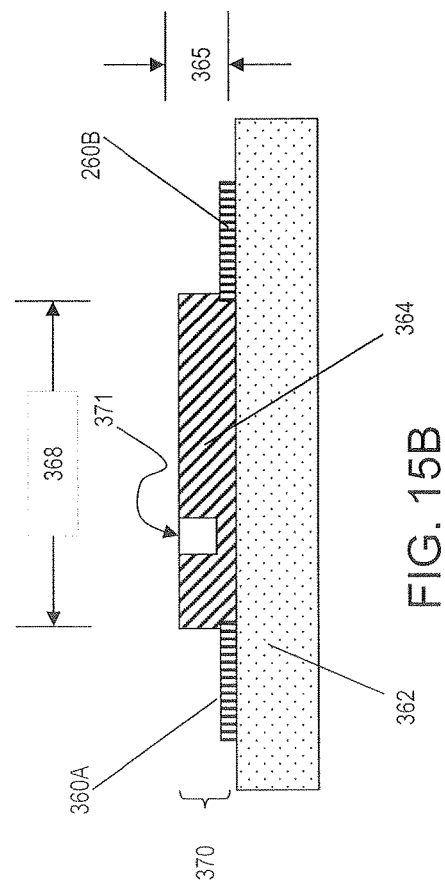

Reference is now made to FIGS. 15A-29B to describe methods to assemble a plurality of passive components useful in the construction of a power management module within a circuit board or interconnect structure for system-in-package (SIP) embodiments (see FIG. 9), or on the surface of a semiconductor die for system-on-chip (SOC) embodiments as shown in FIG. 10. The invention utilizes the selective deposition methods discussed above to form a plurality of passive components having a wide range of resistance, capacitance, inductance and impedance values on single interconnect layer or semiconductor surface. As shown in FIGS. 15A, 15B, a discrete resistor element 370 consists of at least two conducting electrodes 360A, 360B that are affixed directly to the surface of a substrate 362. The substrate 362 may comprise semiconductor die in SOC embodiments, or alternatively can be a sacrificial substrate or layer in SIP embodiments. The at least two conducting electrodes 360A, 360B are derived from a low resistivity metal, such as copper, silver, or gold, or other metal or metal alloy with superior conducting properties. The two conducting electrodes 360A, 360B may be photolithographically patterned from thin film material, or they may be formed by direct-write methods, such as screen-printing or inkjet printing. In the case of SIP embodiments, the sacrificial substrate layer 362 can be a peel-apart foil that generally comprises a high quality thin film used to form the conducting electrodes, a chemical stop layer, such as a chromate monolayer, and a more mechanically rugged carrier foil or plate. Resistive electroceramic 364 is selectively deposited between the conducting electrodes 360A, 360B. The thickness 365 of the resistive electroceramic 364, the width 366 of resistive electroceramic 364, and the spacing 368 between the two conducting electrodes 360A, 360B, are all selected to produce a targeted performance value for the resistive element 370, given the intrinsic resistivity (measured in .OMEGA.-cm) of the resistive electroceramic 364. The resistance value of a resistor element can also be finely tuned by laser trimming, which carves a recess 371 into the resistive electroceramic.

Resistive electroceramic compositions are usually classified in terms of their crystal structure and typically contain the following metal oxides as a primary component: copper oxide (CuO), nickel oxide (NiO), ruthenium oxide (RuO.sub.2), iridium oxide (IrO.sub.2), rhomdium oxide (Rh.sub.2O.sub.3), osmium oxide (OsO.sub.2), and antimony oxide (Sb.sub.2O.sub.3). This group of primary metal oxides comprises the group of preferred electroceramic compositions. These single component resistive electroceramics adopt a rutile crystal structure, with the exception of antimony oxide ($Sb_2O_3$) and rhomdium oxide ($Rh_2O_3$), which have a trigonal crystal structures, and copper oxide (CuO) and nickel oxide (NiO), which have a cubic close-packed crystal structure. Intrinsic resistivity of the primary metal oxides with rutile crystal structures can be altered when the rutile primary oxides are combined together and with one or more transition-metal oxides and/or heavy-metal oxides in amounts that crystallize into a pyrochlore crystal structure. Intrinsic resistivity of the primary metal oxides with rutile crystal structures can also be altered when the rutile primary oxides are combined together and with one or more alkaline earth metal oxides and heavy-metal oxides in amounts that crystallize into a perovskite crystal structure. The compositional chemistry of these crystal structures generally adopt the following formulas:

1. $M^{(1)}M^{(2)}_2O_7$ (pyrochlore) (3a)

2. $M^{(3)}M^{(2)}O_3$ (perovskite). (3b)

Where $M^{(1)}$ represents one or more trivalent transition-metal oxides and/or one or more trivalent heavy-metal oxides, $M^{(2)}$ represents one or more of the primary metal oxides with rutile crystal structure cited above, and $M^{(3)}$ represents one or more alkaline earth metal oxides. Preferred trivalent transition-metal oxides are from the group consisting of: scandium oxide ($Sc_2O_3$), titanium oxide, ($Ti_2O_3$), vanadium oxide ($V_2O_3$), chromium oxide ($Cr_2O_3$), manganese oxide ($Mn_2O_3$), iron oxide ($Fe_2O_3$). Preferred heavy-metal oxides are drawn from the group consisting of bismuth oxide ($Bi_2O_3$), lanthanum oxide ($La_2O_3$), cerium oxide ($Ce_2O_3$), lead oxide (PbO) and neodymium oxide ($Nd_2O_3$). Preferred alkaline earth metal oxides are drawn from the group consisting of magnesium oxide (MgO), calcium oxide (CaO), strontium oxide (SrO), and barium oxide (BaO). Indium-tin oxide (ITO) and antimony-tin oxide are preferred electroceramic compositions when there is a need to have an optically transparent conductor or resistive element, for instance in optical display applications.

Figure 16C:
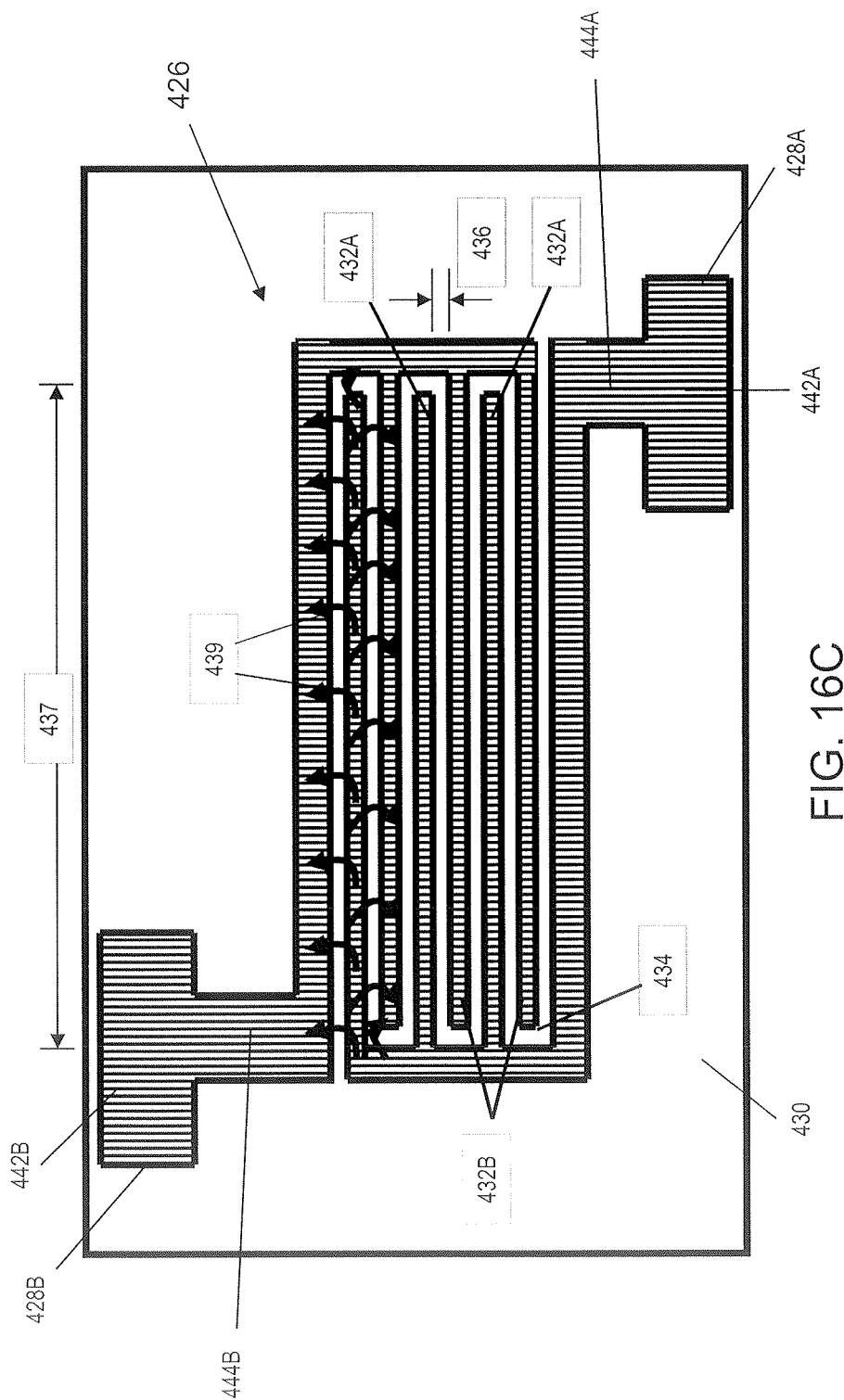
Figure 16G:
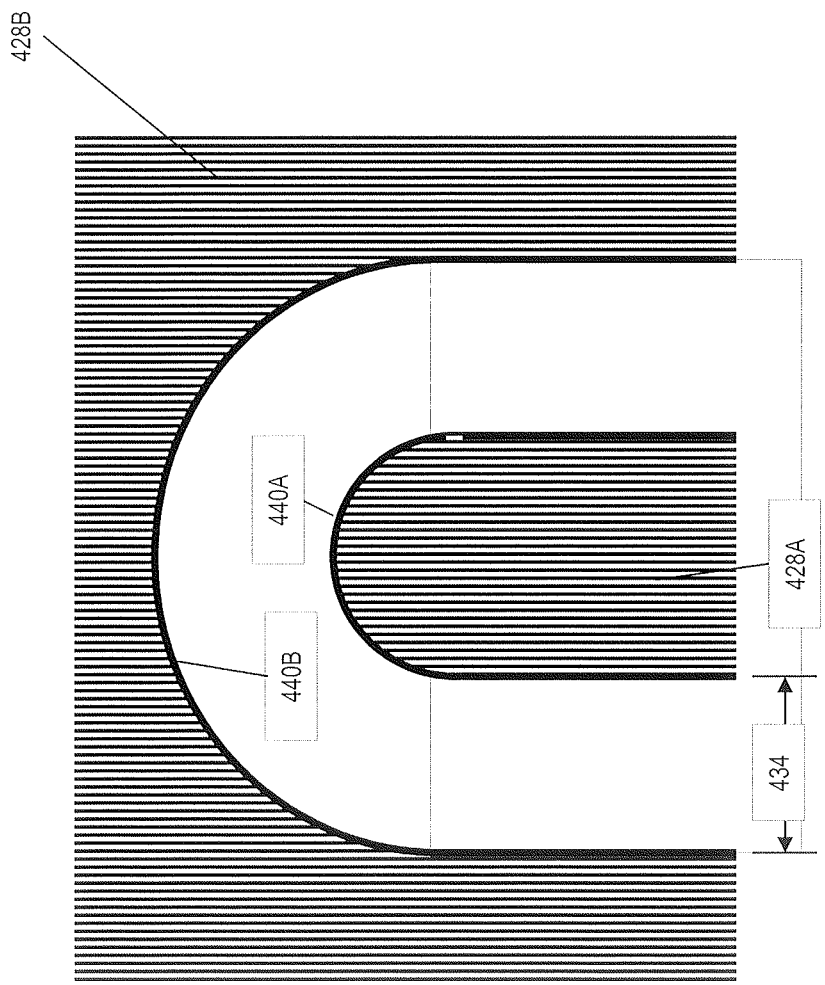

Reference is now made to FIGS. 16A, 16B, 16C, 16D, 16E, 16F, and 16G that describe methods to apply discrete capacitor components on the surface of a semiconductor die for SOC embodiments or embed them within a printed circuit board or an interconnect structure for SIP embodiments. As shown in FIGS. 16A, 16B, the discrete parallel plate capacitor 416 is one embodiment for a discrete capacitor element. It consists of dielectric material 417 having relative permittivity $\epsilon_R \geq 10$, preferably $\epsilon_R \geq 100$, inserted between a top electrode 418 and a bottom electrode 419. The relative permittivity ($\epsilon_R$) and thickness (d) 421 of the dielectric material 417, and the surface area 422 of the top 418 or bottom 419 electrodes, which ever is smaller, principally determine the total capacitance C of the discrete capacitor element 416, in accordance with $C = A \epsilon_o \epsilon_R / d$, where A is the total area of the parallel plates, $\epsilon_o$ is the permittivity of free space, $\epsilon_R$ is the relative permittivity of the electroceramic inserted between the conductinf electrodes forming the parallel plates, and d is the electrode separation or ceramic thickness. The parallel plate capacitor is assembled by patterning the bottom electrode 419, at least one trace conductor 423 and a via pad 424 in a metallization layer affixed to a substrate 425, which comprises semiconductor die in SOC embodiments, or a sacrificial layer in SIP embodiments using the methods discussed above. Tight dimensional controls on the dielectric thickness 421 and the electrode surface areas 422 are required to achieve high tolerance. A preferred embodiment for a discrete capacitor element is shown in FIGS. 16C, 16D, 16E, 16F and 16G. The inter-digitated capacitor 426 incorporates two opposed electrodes 428A, 428B that are patterned into a single metallization layer that has been applied to a substrate 430. Each electrode has respective electrode fingers 432A and 432B that are interleaved with the fingers of the opposed electrode to produce meandering line capacitance in the gap between the two sets of fingers. High permittivity electroceramic 433 (FIGS. 16E, 16F) is selectively deposited on and between the electrode fingers 432A, 432B to fill the gap spacing 434 that exists between the opposed electrode fingers 432A, 432B and complete the capacitor 426. To first order, the capacitance is determined by the gap spacing 436 between fingers 432A and 432B, the mean finger length 437 and the dielectric permittivity of the electroceramic 433. Therefore, manufacturing to high tolerance is limited to maintaining tolerance controls over a two process parameters: the accuracy of the patterned electrode fingers 428A, 428B and the chemical/microstructure properties and thickness 438 of the high permittivity electroceramic 433. The occurrence of strong fringing fields 439 (FIG. 16D) that protrude above the electrodes 428A, 428B is an artifact of inter-digitated capacitors that can affect tolerances. The extent to which these fields protrude is inversely proportional to the relative permittivity ($\epsilon_R$) of the high-K electroceramic 433. The high permittivity electroceramic 433 should have a relative permittivity $\epsilon_R \geq 50$, and preferably $\epsilon_R \geq 100$, with respective thicknesses 438 (FIG. 16F) that are $\geq 10$ $\mu m$, and 6 $\mu m$, respectively, to mitigate the affect of fringing fields on tolerance. Performance tolerance controls are also improved by maintaining uniform line capacitance within the device. Therefore, it is an additional preferred embodiment to utilize curved edges 440A, 440B (FIG. 16G) at the end points where the electrode fingers 432A, 4328 interlock to preserve uniform spacing 434 throughout the capacitor's meander path. The discrete inter-digitated capacitor 426 maintains electrical communication to via pads 442A, 442B through one or more electrical traces 444A, 444B making electrical contact with the electrode fingers 432A, 432B.

High permittivity electroceramics preferred under this invention have perovskite crystal structures and will generally have the following chemical formula.

1. $M^{(1)}M^{(2)}O_3$ (4a)

Where metals from group $M^{(1)}$ and $M^{(2)}$ exist in 1:1 molar ratios. It is possible for a plurality of metals to be represented within each group; however, the combined molarity for each group must remain the same. For instance, if two metals, $M^{(1a)}$, $M^{(1b)}$, are selected from group $M^{(1)}$ and two other metals are selected from group $M^{(2)}$, the chemical formula (3) is modified as:

a. $M^{(1a)}_{(1-x)}N^{(1b)}_{(x)}M^{(2a)}_{(1-y)}M^{(2b)}_{(y)}O_3$. (4b)

Group $M^{(1)}$ metal oxides preferred for use in high permittivity electroceramics include: alkaline earth metal oxides selected from the group consisting of magnesium oxide (MgO), calcium oxide (CaO), strontium oxide (SrO), and barium oxide (BaO); alkali metal oxides selected from the group including lithium oxide ($Li_2O$), sodium oxide ($Na_2O$), potassium oxide ($K_2O$), and rubidium oxide (Rb.sub.2O); and heavy-metal oxides selected from the group including lanthanum oxide (La.sub.2O.sub.3), cerium oxide (Ce.sub.2O.sub.3), lead oxide (PbO) and neodymium oxide (Nd.sub.2O.sub.3). Group M.sup.(2) metal oxides preferred for use in high permittivity electroceramics include: titanium oxide (TiO2), zirconium oxide (ZrO), hafnium oxide (HfO), tantalum oxide (Ta.sub.2O.sub.5), and niobium oxide (Nb.sub.2O.sub.5).

Figure 17A:
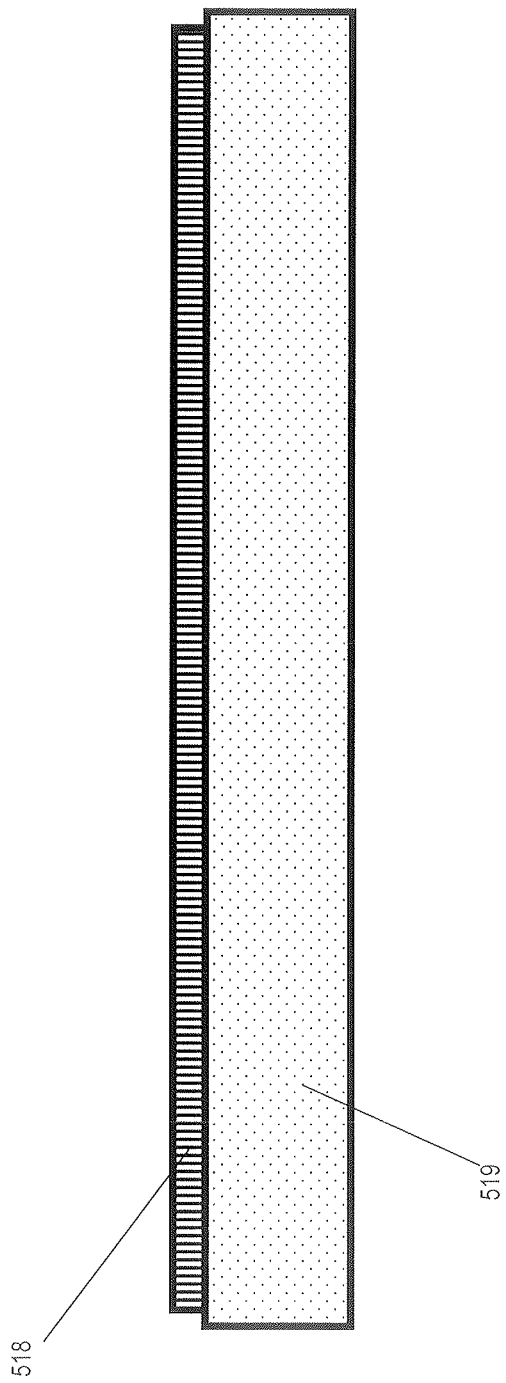
Figure 17F:
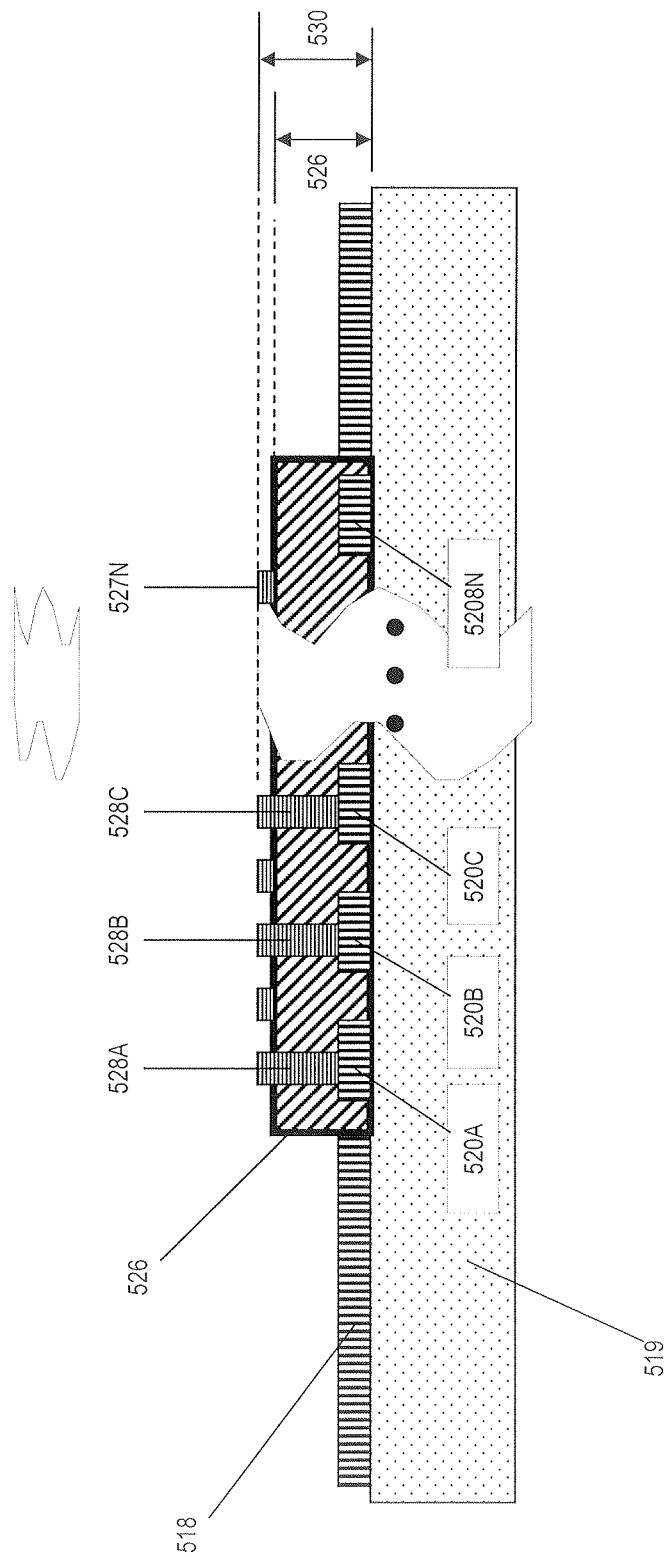
Figure 17G:
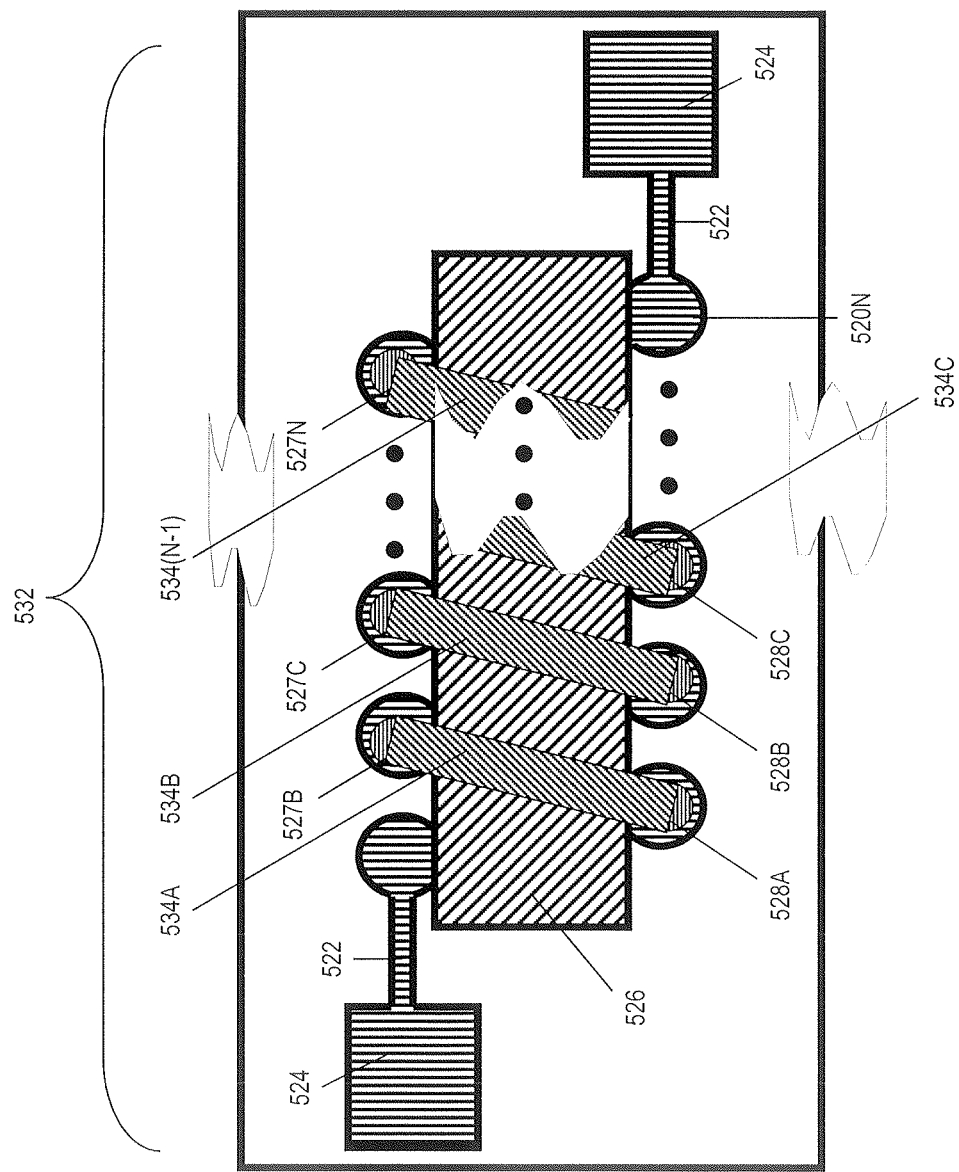

Reference is now made to FIGS. 17A, 17B, 17C, 17D 17E, 17F and 17G to describe methods to fabricate at least one LCD ceramic inductor coil or toroidal transformer (see FIG. 7) that is located on the surface of a semiconductor die or embedded within a dielectric layer that is integrated into printed circuit board or interconnect structure. It should be noted that the method of manufacture for a single LCD ceramic inductor coil is identical to the fabrication of the toroidal transformer, with the exception that the single inductor coil is wound around a ferromagnetic ceramic bar that functions as the inductor core, while the toroidal transformer has at least two coils wound around a ceramic loop that functions as the inductor core. Practitioners skilled in the art of microfabrication should easily extrapolate the changes in metallization patterning and selective ceramic deposition needed to fabricate the toroidal transformer from the single inductor coil. A patterned metallization layer 518 is affixed to a substrate 519 (FIG. 17A). The substrate 519 may be a semiconductor die with active circuitry (transistor switches and/or rectifying diodes) embedded within for SOC embodiments, or it may be a sacrificial substrate layer in SIP embodiments. The patterning in the metallization layer 518 provides at least two sets of pads 520A, 520B, 520C, . . . , 520N and 521A, 521B, 521C, . . . , 521N that are used to construct the coil windings, at least one conductive trace 522, and at least one via pad 524 in FIG. 17B to route signals within the layer that contains the inductor coil or to route signals to other layers that maintain electrical communication with the layer. A first set of conducting elements 525A, 525B, 525C, . . . , 525N are inserted between conducting pads 520A and 521A, 520B and 521B, 520C and 521C, and 520N and 521N, respectively, to form the lower half of the coil (FIG. 17C). The conducting elements may be formed within the patterned metallization layer 518 or, preferably, they may comprise round wire bonds, which have higher self-inductance and lower resistivity. An electroceramic 526 (FIG. 17D) having relative permeability .mu..sub.R.noteq.1 is selectively deposited between the two sets of pads (520A, 520B, 520C, . . . , 520N and 521A, 521B, 521C, . . . , 521N) and over the conducting elements 525A, 525B, 525C, . . . , 525N (FIG. 1710. Vertical interconnects 527B, 5270, . . . , 527N and 528A, 528B, 528C, . . . , 528(N−1) (FIGS. 17E, 17F), preferably metal studs, having height 530 equal to or 10-20% greater than the thickness of magnetic electroceramic 526 are inserted on pads 520B, 520C, . . . , 520N and 521A, 521B, 521C, . . . , 521(N−1), respectively. The thickness of deposited magnetic electroceramic 526 should be in the range 10 .mu.m.ltoreq.t.ltoreq.5,000 .mu.m, preferably in the range 100 .mu.m.ltoreq.t.ltoreq.500 .mu.m. FIG. 17G shows how the ceramic inductor coil 532 is completed by stitch bonding a second set of conducting wire elements 534A, 534B, 534C, . . . , 534(N−1), between vertical interconnects 528A and 527B, 528B and 527C, 528C and 527(C+1), . . . , 528(N−1) and 527N, respectively. The resistance, dimensional uniformity, and surface roughness of the metal conductor used to fabricate the coil, and the precision placement of the all conducting elements are key tolerance parameters, which is why wire bonding methods are preferred. Stud bumping and stitch bonding equipment having a bond placement accuracy <.+−0.5 .mu.m, preferably .ltoreq..+−.3.5 .mu.m, a height accuracy of .ltoreq..+−.10 .mu.m, preferably .toreq..+−0.3 .mu.m, and a minimum pitch of 60 .mu.m, preferably 50 .mu.m, such as that provided by the AT Premier (in AccuBump mode), K&S, Willow Grove, Pa., are recommended process tools. Laser trimming the selectively deposited electroceramic 526 is recommended to maintain accurate control over dimensional tolerances.

Figure 18A:
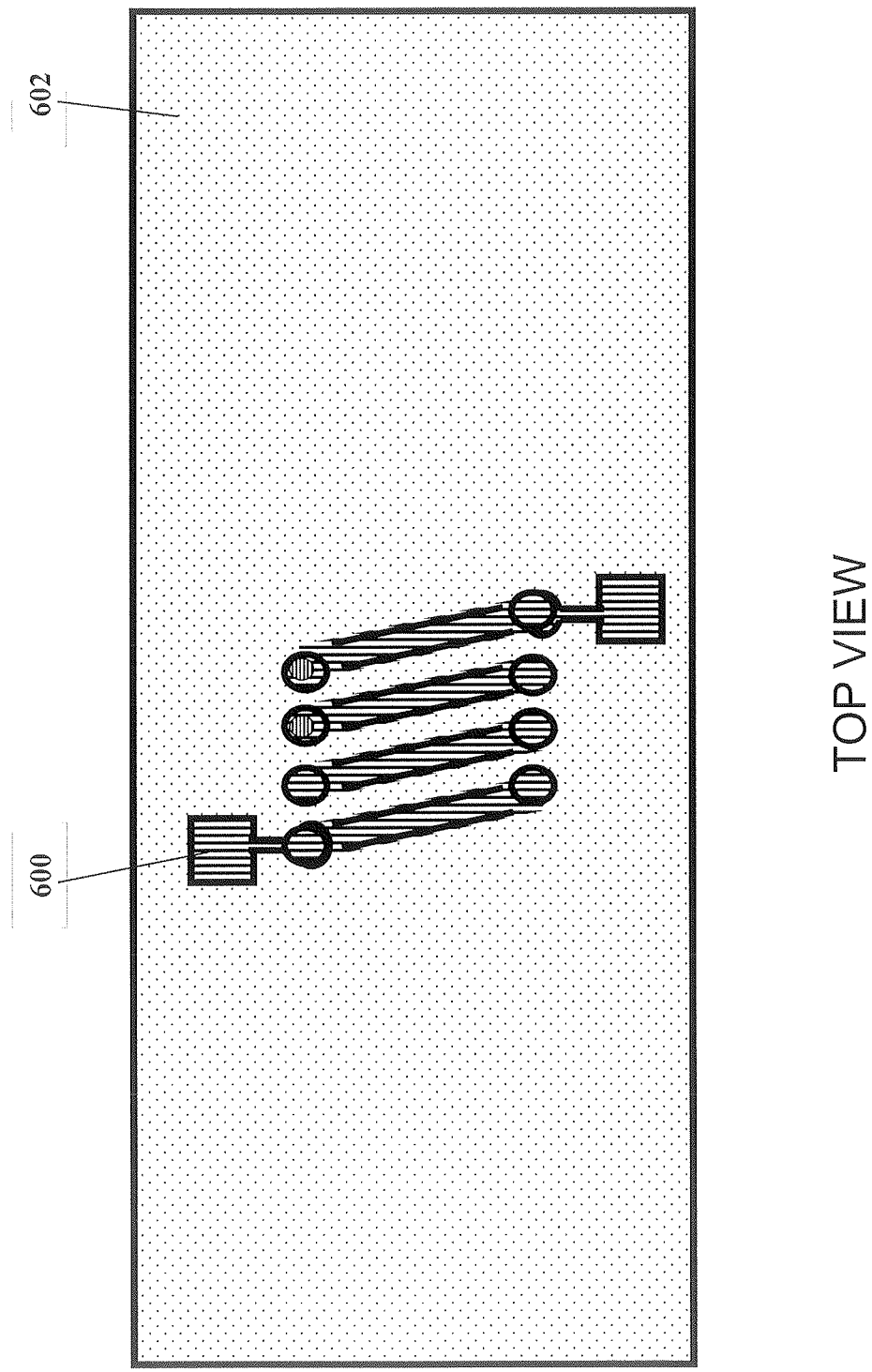
FIGS. 18A-18G are schematic views of process steps used for fabricating a transformer in accordance with the present embodiments.
Figure 18B:
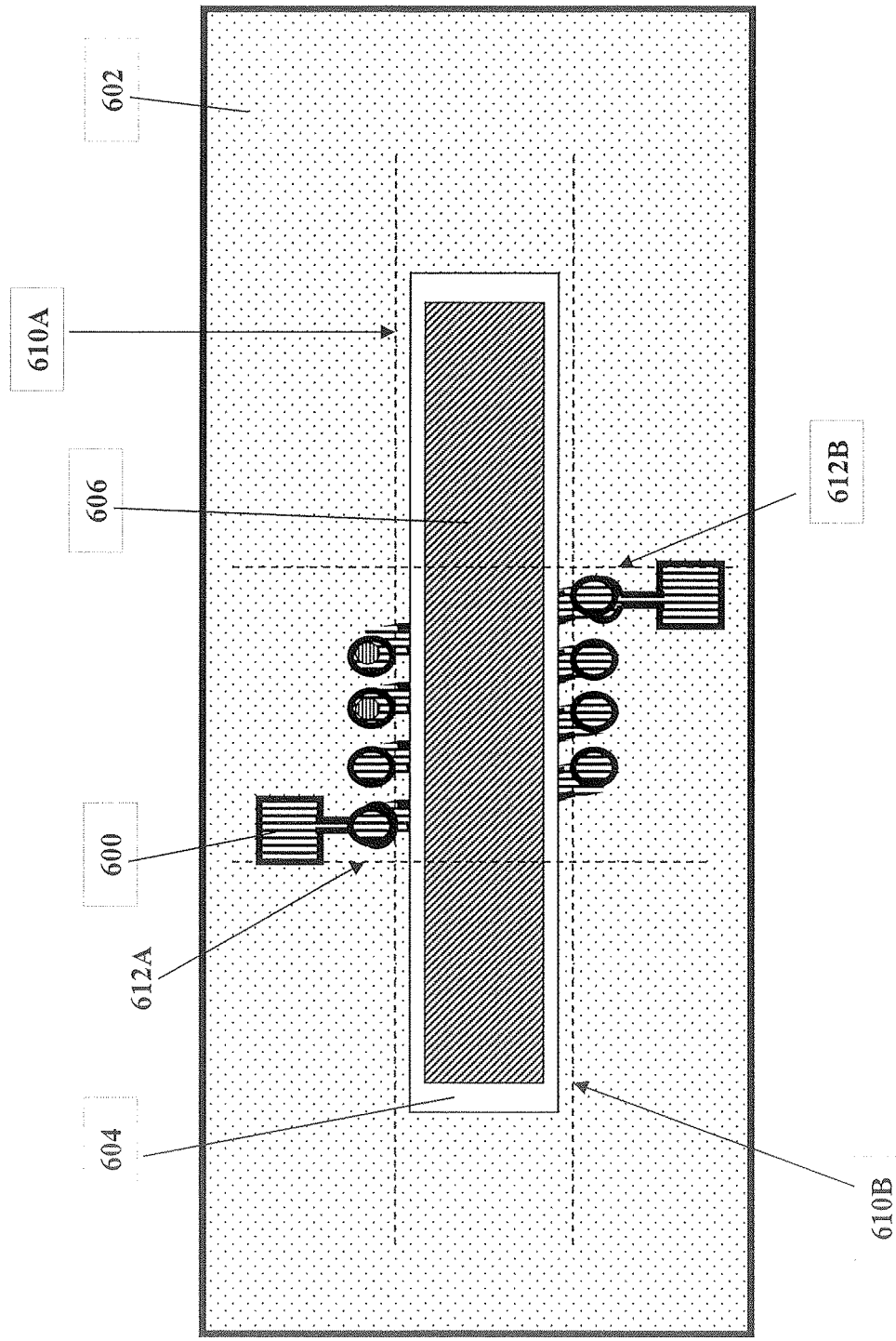
Figure 18C:
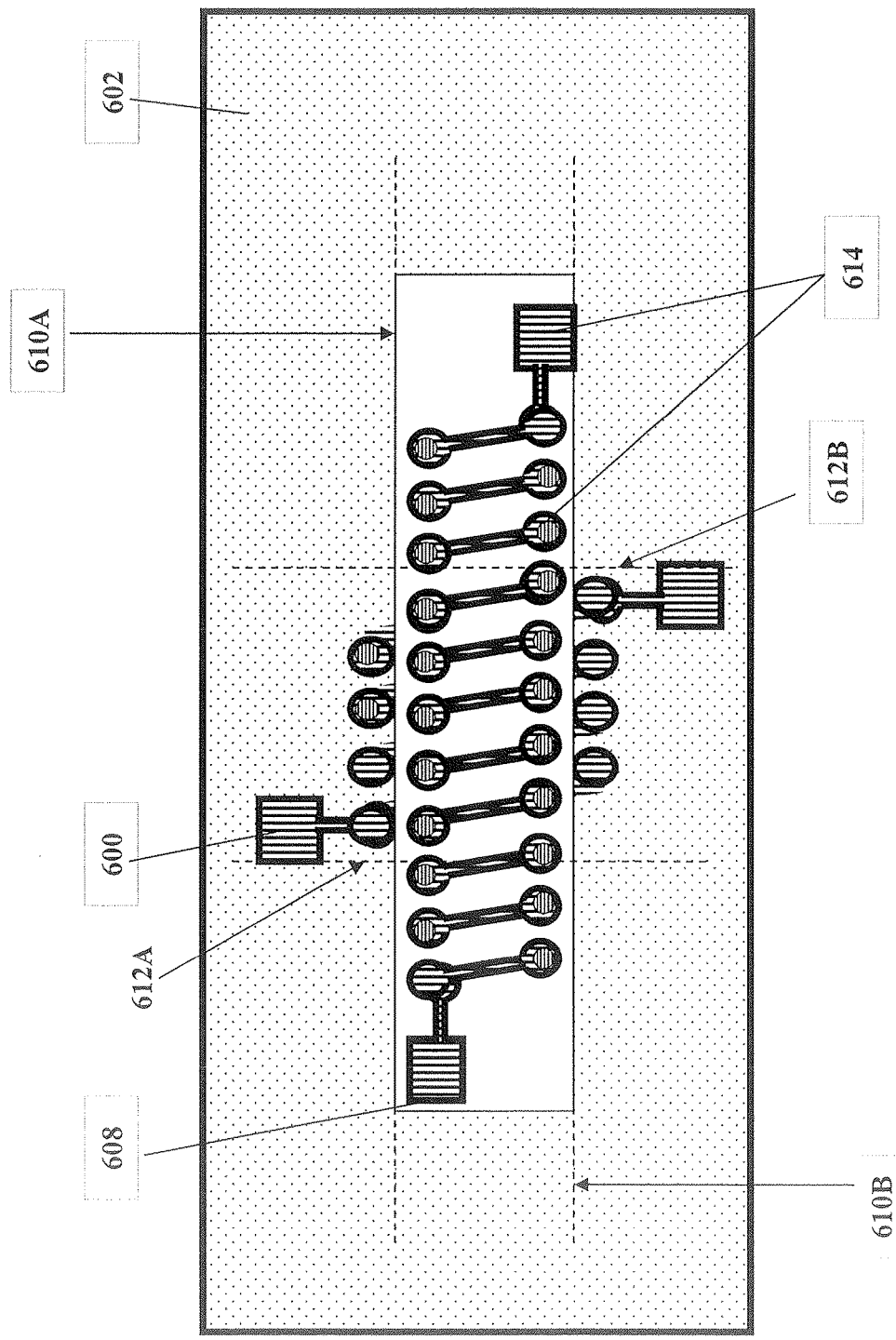
Figure 18D:
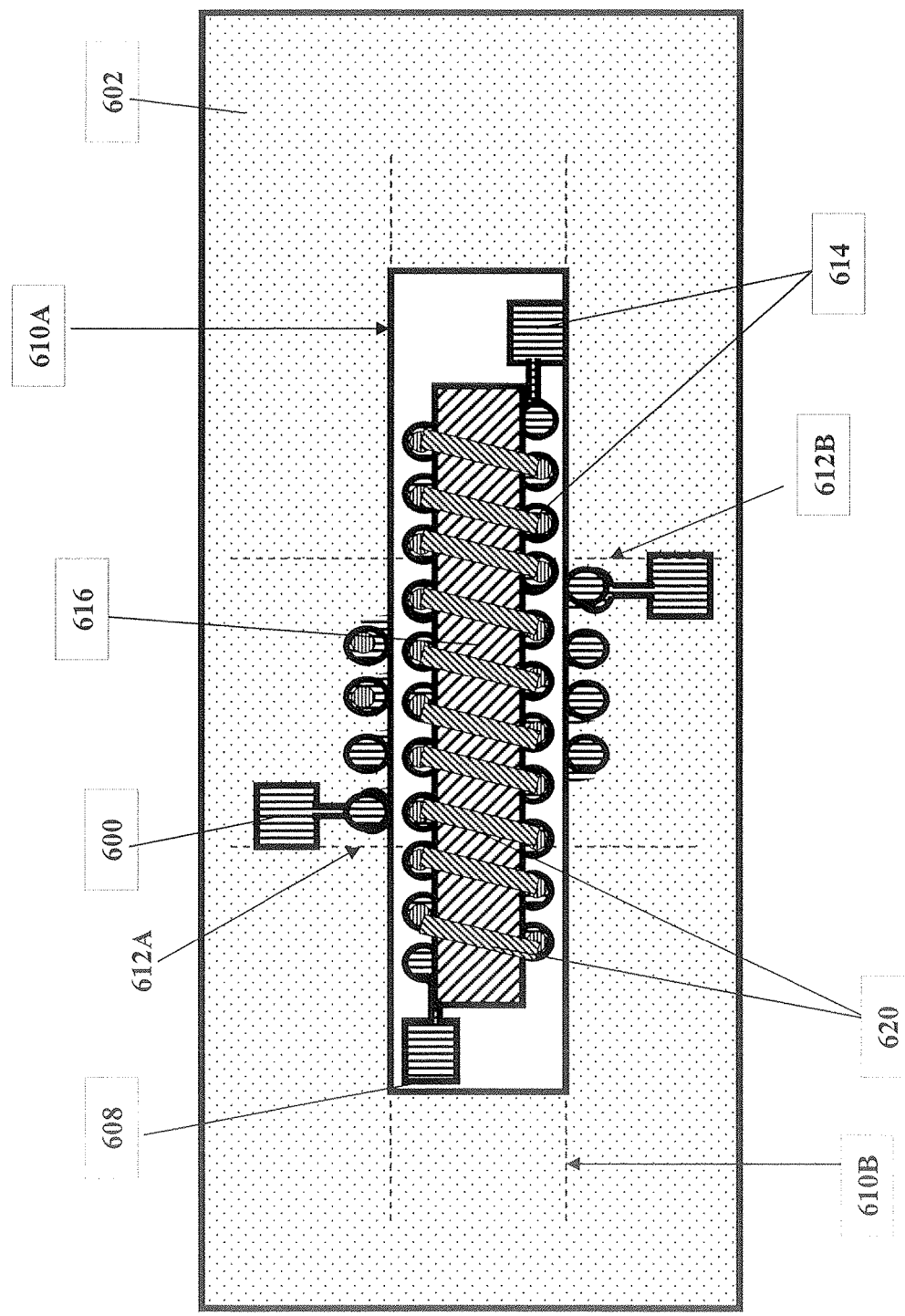
Figure 18E:
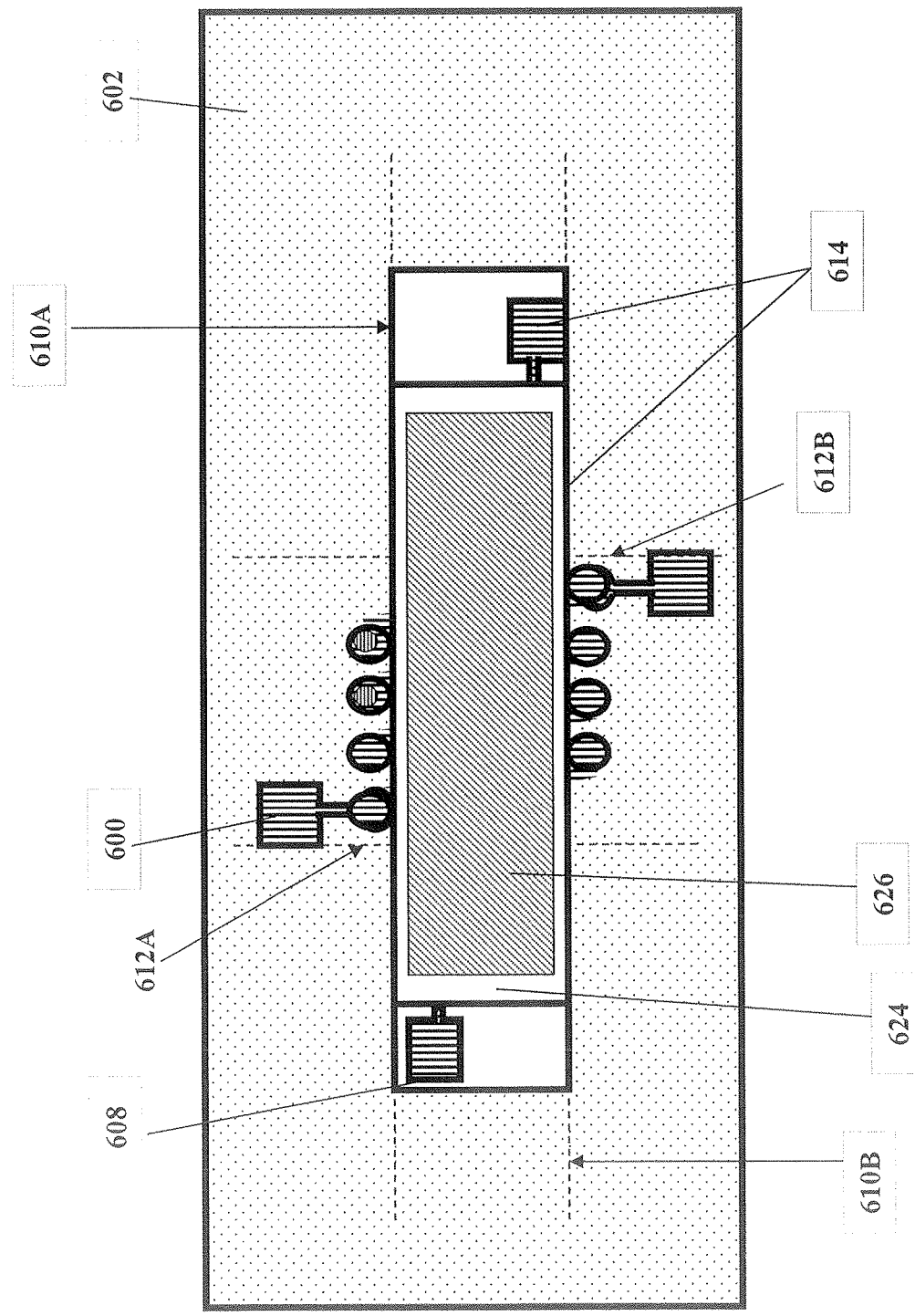
Figure 18F:
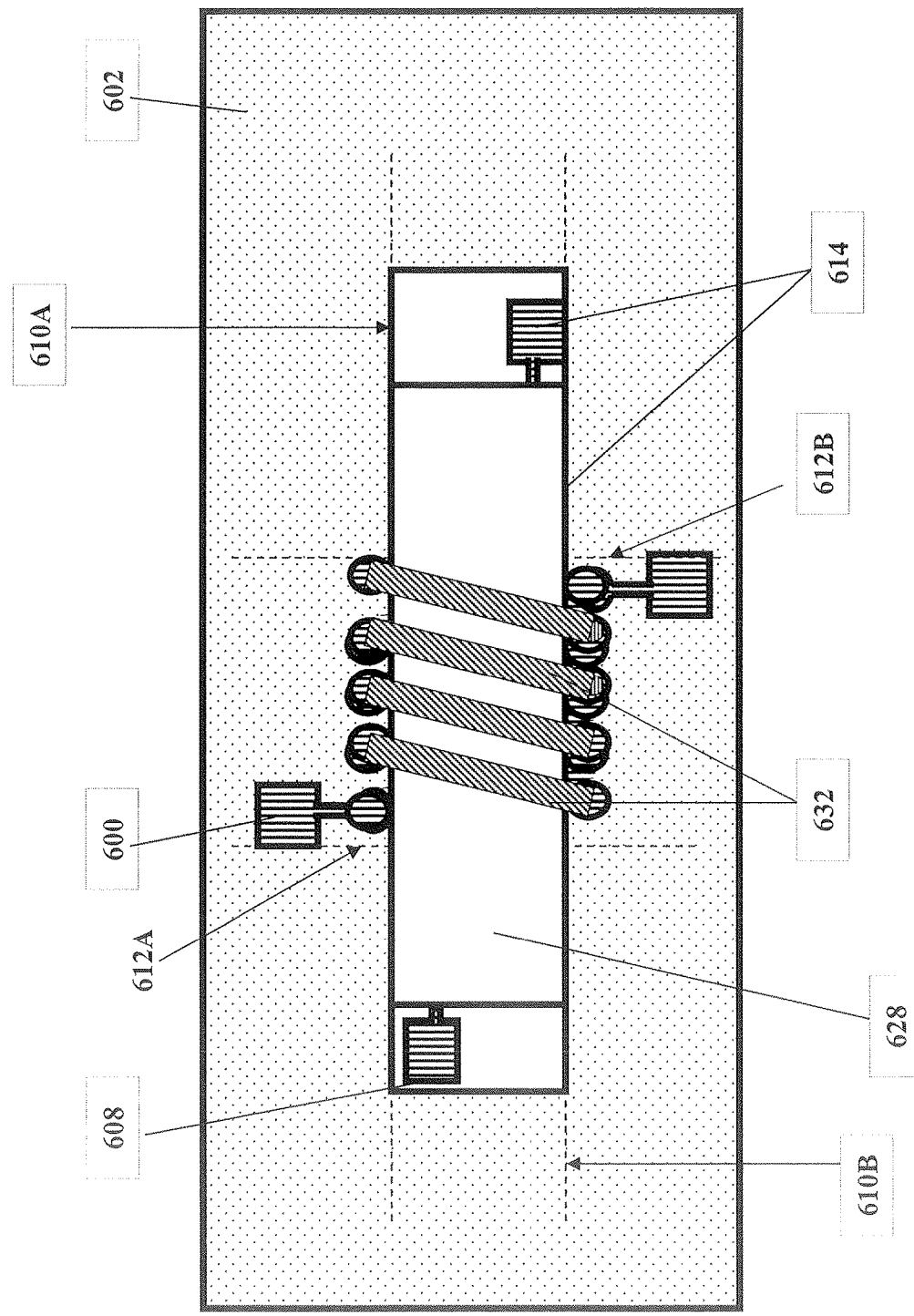
Figure 18G:
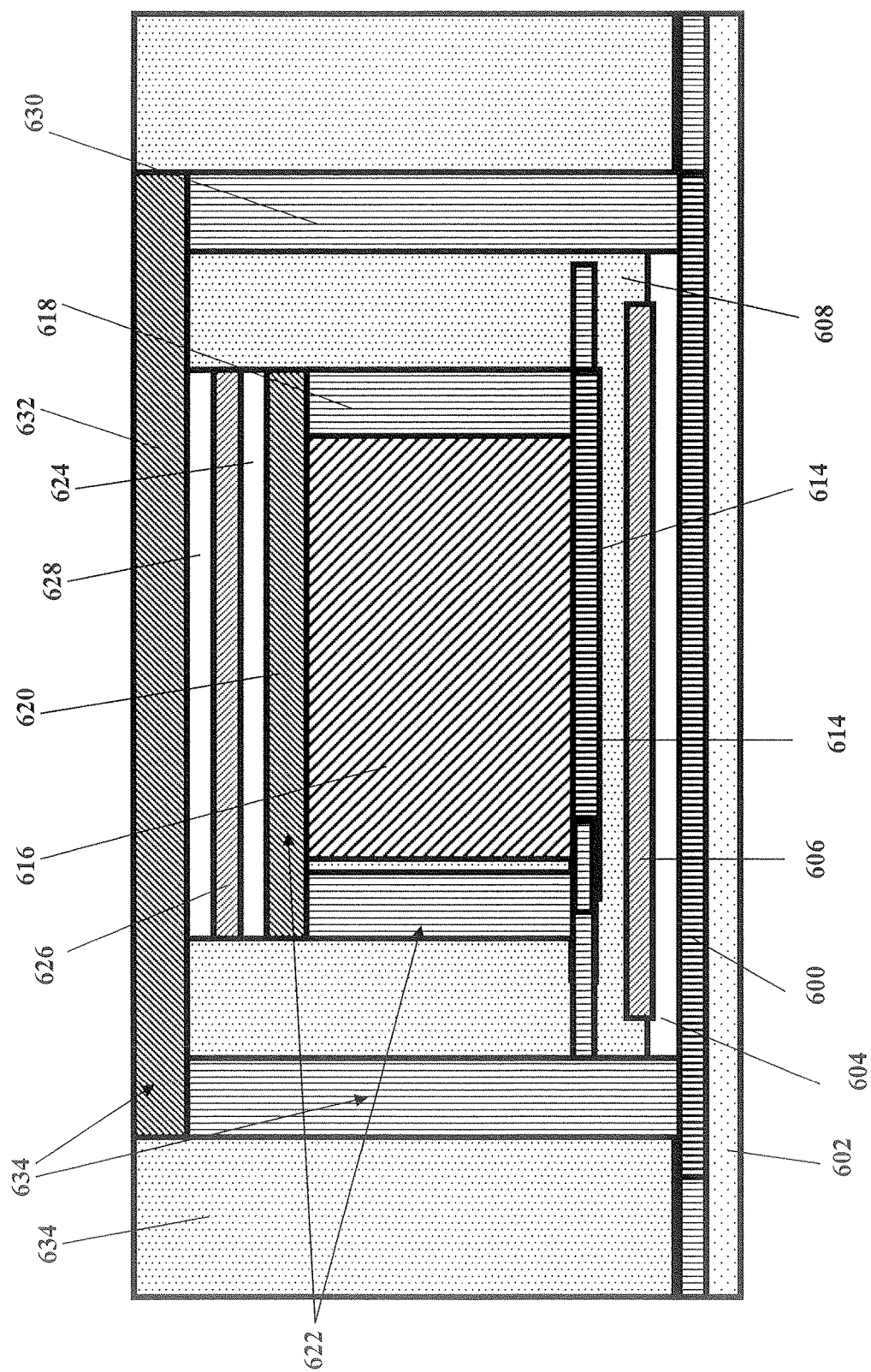

Reference is now made to FIGS. 18A, 18B, 18C, 18D, 18E, 18F, and 18C to show how the methods described above are applied to fabricate the alternative transformer as shown in FIGS. 8A, 8B, which has at least two (2) inductor coils wound around the same bar of LCD ceramic inductor core. A first metallization 600 layer affixed to a substrate 602 is patterned to form the bottom electrical contacts for the outer inductor coil (FIG. 18A). The substrate 602 may be a semiconductor die with active circuitry (transistor switches and/or rectifying diodes) embedded within for SOC embodiments, or it may be a sacrificial substrate layer in SIP embodiments. A first lower layer of insulating ceramic dielectric 604, preferably amorphous silica ceramic, is selectively deposited between the contact pads as shown in FIG. 18B. A lower shielding layer 606 comprising a conductive medium, preferably a metal conductor, may optionally be selectively applied on top of the first layer of insulating ceramic dielectric 604. A second lower layer of insulating ceramic dielectric 608 may optionally be selectively applied on top of the optional conductive shielding layer 606 (FIG. 18C). The insulating ceramic dielectric layers 604, 608, as well as the optional conductive shielding layer 606 are placed within the sides 610A, 610B of the patterned metallization layer 600, but may extend beyond the ends 612A, 612B. A second metallization layer 614 is patterned on top of the first insulating ceramic layer 604 (or optional second layer 608 of insulating ceramic dielectric, as the case may be) to form the bottom electrical contacts for the inner coil. An LCD ferromagnetic inductor core 616 is then selectively deposited within the periphery of the second patterned metallization layer 614 (FIG. 18D). Vertical interconnects 618 (FIG. 18G) are then appropriately placed by means of stud bumping on the contact pads in the second patterned metallization layer 614. A third patterned metallization 620 is then applied, preferably through the use of wire bonds though other techniques, such as electroplating, may also be used to complete the winding of the inner inductor coil 622. A first upper layer of insulating ceramic dielectric 624, preferably an amorphous silica dielectric, is selective applied on top of the inner inductor coil 622 (FIG. 18E). An upper shielding layer 626 may optionally be selectively applied on top of the first upper layer of insulating ceramic dielectric layer 624. A second upper layer of insulating ceramic dielectric 628 may optionally be selectively applied to the upper shielding layer (FIG. 18F). Vertical interconnects 630 are then appropriately placed by means of stud bumping on the contact pads in the first patterned metallization layer 600. A fourth patterned metallization 632 is then applied, preferably through the use of wire bonds though other techniques, such as electroplating may also be used, to complete the winding of the outer inductor coil 634. The entire coil assembly can subsequently be embedded within an electrically insulating encapsulant 636 that comprises selectively deposited LCD ceramic or a mechanically rigid polymer (FIG. 18G).

It is another specific embodiment of the invention to produce elemental ceramic inductor coils providing inductance in the range of 0.01 pH to 500 pH with performance values ≤+−.5%, preferably ≤+−.1% of the targeted value. Electroceramic permeability is primarily a function of electroceramic composition, grain size, and is usually dependent upon frequency and temperature. Preferred electroceramic compositions for use in a ceramic inductor coil include ferrites and garnets. Ferrites adopt body-centered cubic crystal structure and have the following chemical formula:

1. $M_1Fe_2O_4$ (5a)

Where Fe is iron oxide and $M_1$ represents one or more select metal oxides having a total molar concentration that is half the iron oxide molar concentration. Group $M_1$ metal oxides preferred for use in high permeability ferrite electroceramics include: cobalt monoxide (CoO), nickel oxide (NiO), zinc oxide (ZnO), manganese oxide (MnO), copper oxide (CuO), vanadium oxide (VO), magnesium oxide (MgO) and lithium oxide ($Li_2O$). Garnets adopt either rhombic dodecahedron or trapezohedron crystal structures, or a combination of the two, and have the following chemical formula:

i. $A_3B_2(SiO_4)_3$ (5b)

Where group A metal oxides have equal molar concentration to silicon oxide and group B metal oxides have molar concentration that is ⅔ the molar concentration of silicon oxide. Group A metal oxides preferred for use in high permeability garnet electroceramics include: calcium oxide (CaO), magnesium oxide (MgO), iron oxide (FeO), and manganese oxide (MnO). Group B metal oxides preferred for use in high permeability garnet electroceramics include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). Ceramic inductor coils 532 (FIG. 17G) having inductance values ranging from 0.01 pH to 1,000 μH and tolerances ≤+−.5%, preferably ≤+−.1%, will comprise ferrite or garnet electroceramic 526 selectively annealed to have controlled microstructure with grain size ranging from 10 nm to 25 μm, preferably from 250 nm to 5 μm.

Figure 19:
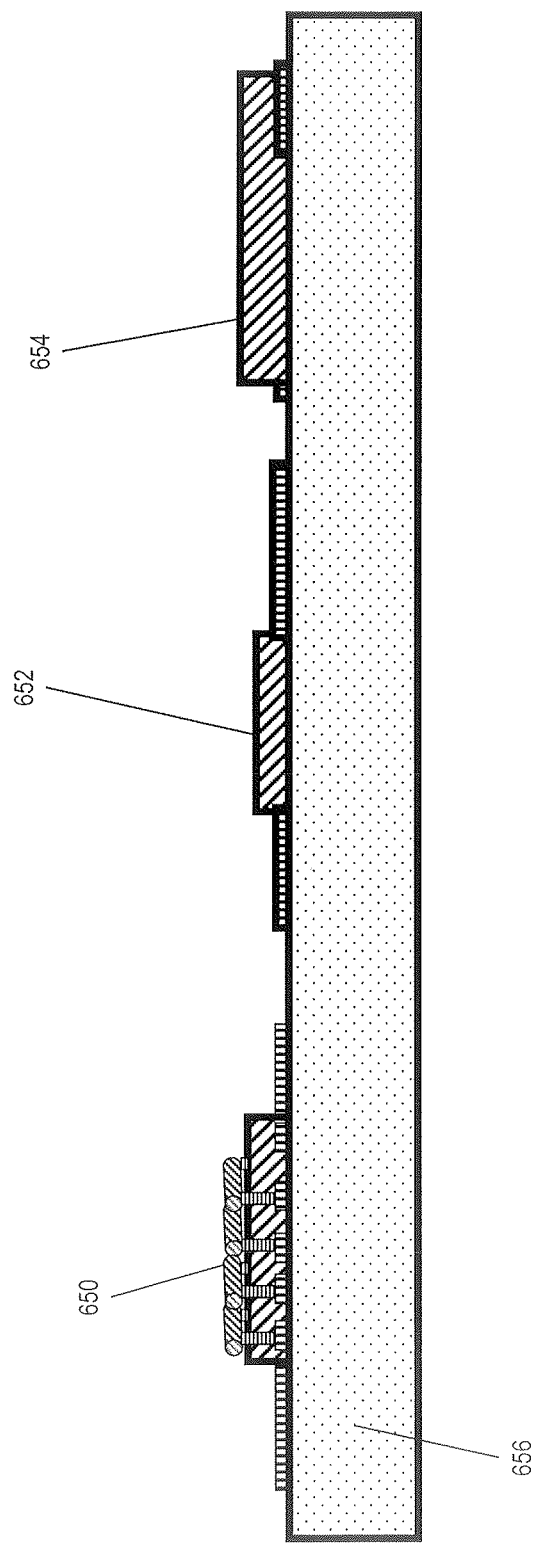
FIG. 19 is a schematic side view of a system-on-chip constructed in accordance with an embodiment of the present invention.

Reference is now made to FIG. 19 to describe methods to integrate at least one discrete inductor coil 650, optionally at least one discrete capacitor 652, and at least one discrete resistor 654 on a substrate 656 to fabricate a power management module. When substrate 656 is a semiconductor die containing active circuit elements (transistor switches and rectifying diodes), the SOC power management module is completed with the passive components 650, 652, and 654 located on its surface 658 are placed in electrical communication with active components (transistor switches and rectifying diodes) located within the semiconductor die's interior.

Figure 20A:
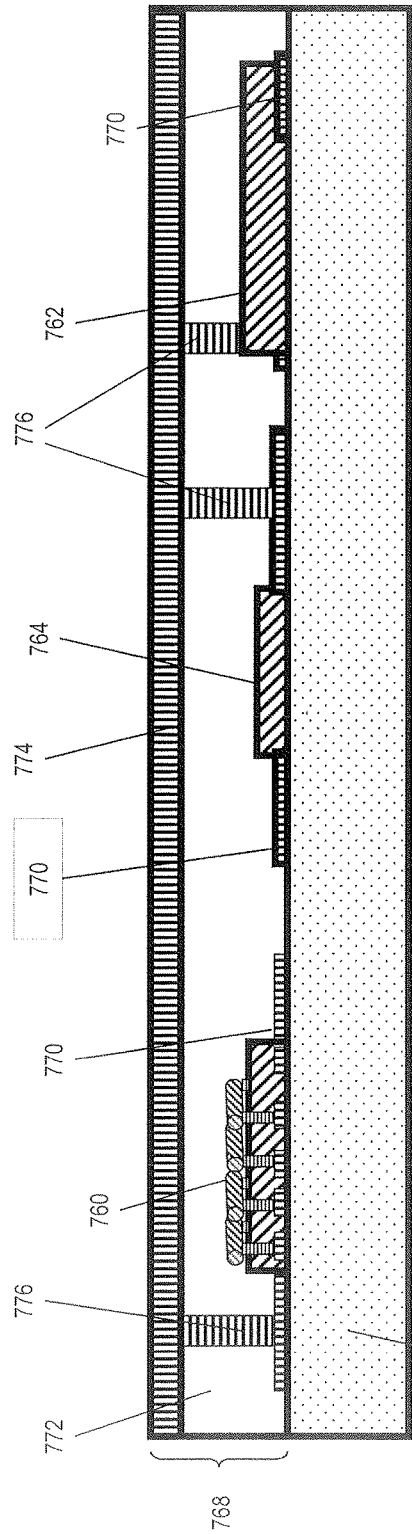
FIGS. 20A and 20B are schematic side views of a system-in-package constructed in accordance with an embodiment of the present invention and a process step for fabricating same.
Figure 20B:
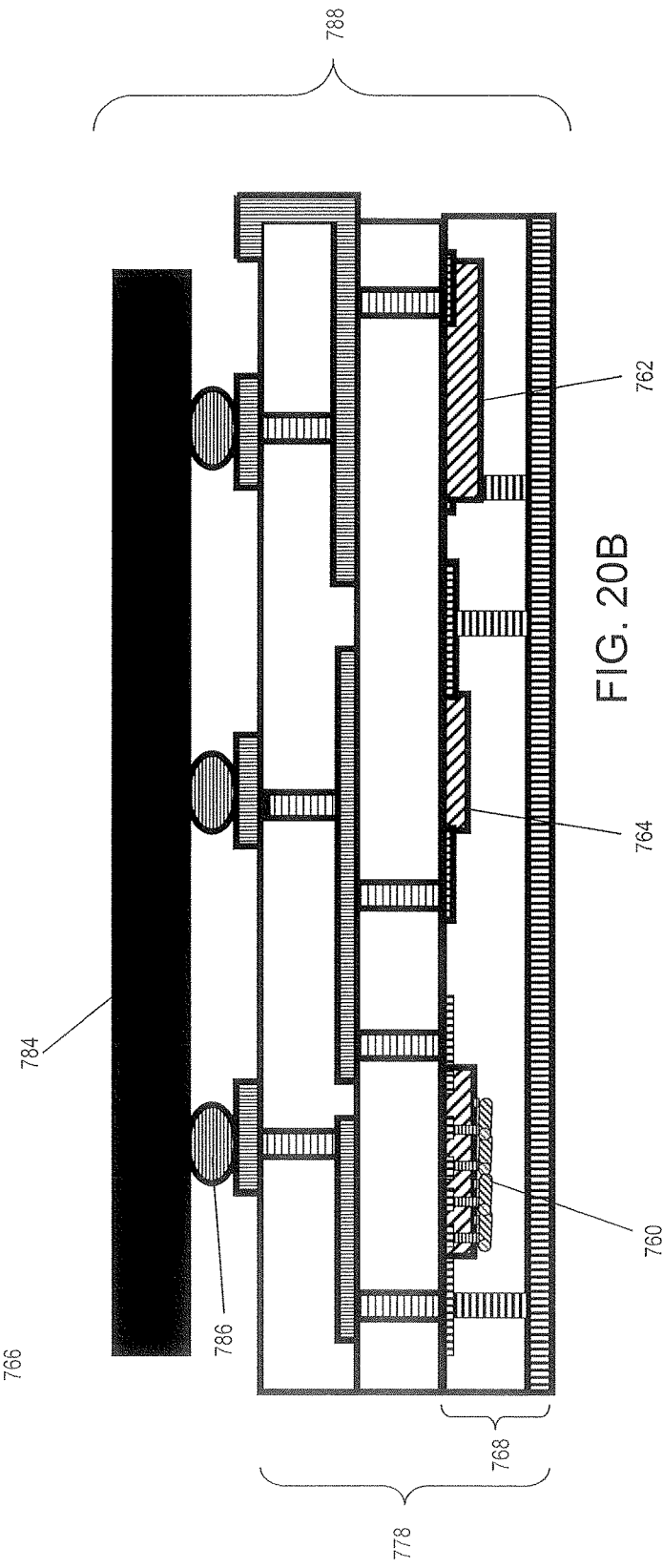

FIGS. 20A, 20B depict an SIP power management module that is constructed by fabricating the passive components 760, 762, 764 on a sacrificial substrate 766. Once all passive components are fabricated within desired tolerances, an insulating dielectric layer 772, a metallization layer 774, and vertical interconnects (vias) 776 that maintain electrical communications between the metallization layer 774 and the at least one via pad 770 of the passive components 760, 762, 764 (where desired) are then applied to the structure. The dielectric layer 772 may be an organic material, such as FR4, polyfluorotetraehylene (PETE) Teflon, or Rogers Duroid materials. Alternatively, the dielectric layer 772 may be an LCD processed inorganic material, such as silica, alumina, or a silicate or aluminate dielectric using a curtain coating or blanket coating liquid aerosol spray. The metallization layer 774 may comprise a ground or power plane, or may be patterned to function as a signal routing network. The metallization layer 774 may be applied using a variety of techniques, such as a metal sheet that is bonded to the dielectric layer through an adhesive agent, or through direct-write methods, such as screen printing or inkjet printing, preferably using low-temperature nano-particle pastes. It is recommended to use a low-temperature metallization technique so the formed structure is subject to maximum temperatures that will not alter the microstructure of the embedded electroceramic. The embedded passive component layer 768, comprising at least one pre-tested embedded passive component 760, 762, 764 in electrical communication with via pads 770 or via 776, is then separated from the sacrificial substrate 766 for use in a printed circuit board or interconnect structure 778. The embedded passive component layer 768 can then be combined with one or more additional signal routing layers into a stacked multilayer structure 478. This electrical network is used to maintain electrical communication between the at least one embedded inductor coil 760, the at least one embedded discrete capacitor 762, and the at least one embedded discrete resistor 764 and a semiconductor device 784 that contains all the active components through conductive means 786 to complete the SIP power management module 788.

Although the invention has been described with respect to various embodiments, it should be realized this invention is also capable of a wide variety of further and other embodiments within the spirit and scope of the appended claims.

What is claimed is:

1. A modulated inductance module comprising:
   an inductor including one or more electrical conductors disposed around a ferromagnetic ceramic element formed on a semiconductor die,
   wherein the inductor further comprises two or more metal oxides having fluctuations in metal-oxide compositional uniformity less than or equal to 1.50 mol % throughout said ceramic element,
   the ceramic element has crystalline grain structure having a diameter that is less than or equal to 1.5× a mean grain diameter,
   and,
   the semiconductor die contains active semiconductor switches or rectifying components that are in electrical communication with the one or more electrical conductors of the inductor.

2. The module of claim 1, wherein the one or more electrical conductors form a plurality of electrical connections to the active switches or rectifying components of the inductor to enable selective variation of the inductance of the inductor.

3. The module of claim 2, wherein the inductor forms a transformer coil.

4. The module of claim 2, wherein said inductor is part of a system-on-chip.

5. The module of claim 2, wherein said inductor is electrically connected to circuitry within said semiconductor die.

6. The module of claim 2, wherein said ferroelectric ceramic element comprises one or more metal oxides that form a body-centered cubic crystalline phase that includes iron oxide ($Fe_2O_3$) and amounts of one or more metal oxides selected from: cobalt monoxide (CoO), nickel oxide (NiO), zinc oxide (ZnO), manganese oxide (MnO), copper oxide (CuO) vanadium oxide (VO), magnesium oxide (MgO) and lithium oxide ($Li_2O$).

7. The module of claim 2, wherein said ferromagnetic ceramic element comprises silicon oxide (SiO4) and adopts a rhombic dodecahedron or rhombic trapezohedron crystalline phase with other metal oxides that include amounts of one or more of: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$), neodymium oxide ($Nd_2O_3$) and holmium oxide ($Ho_2O_3$).

8. The module of claim 2, wherein the ferromagnetic ceramic element has a magnetic permeability that varies 5% over an operating temperature range of −40° C. to +125° C.

9. The module of claim 8, wherein the ferromagnetic ceramic element has a magnetic permeability that varies 1% over an operating temperature range of −40° C. to +125° C.

10. The module of claim 2, which includes a resistive ceramic element formed on the semiconductor die that is electrically connected to the inductor or active circuitry or rectifying components embedded in the semiconductor die.

11. The module of claim 10, wherein resistive ceramic element comprises one or more metal oxides forming a rutile, pyrochlore, or perovskite crystalline phase that includes amounts of copper oxide (CuO), nickel oxide (NiO), ruthenium oxide ($RuO_2$), iridium oxide ($IrO_2$), rhodium oxide ($Rh_2O_3$), osmium oxide ($Os_2O_3$), antimony oxide ($Sb_2O_3$) or indium-tin oxide.

12. The module of claim 11, wherein said one or more metal oxides further includes metal oxides from the group consisting of: bismuth oxide ($Bi_2O_3$), lanthanum oxide ($La_2O_3$), cerium oxide ($Ce_2O_3$), neodymium oxide ($Nd_2O_3$) and lead oxide (PbO).

13. The module of claim 11, wherein said one or more metal oxides further includes alkaline earth metal oxides from the group consisting of magnesium oxide (MgO), calcium oxide (CaO), strontium oxide (SrO), and barium oxide (BaO) or transition metal oxides from the group consisting of scandium oxide ($Sc_2O_3$), titanium oxide ($Ti_2O_3$), vanadium oxide ($V_2O_3$), chromium oxide ($Cr_2O_3$), manganese oxide ($Mn_2O_3$), and iron oxide ($Fe_2O_3$).

14. The module of claim 10, wherein resistive ceramic element has a resistivity that varies ≤1% over an operating temperature range of −40° C. to +125° C.

15. The module of claim 2, which includes a capacitive ceramic element formed on the semiconductor die that is electrically connected to the inductor coil or active circuitry or rectifying components embedded in the semiconductor die.

16. The module of claim 15, wherein the capacitive ceramic element comprises one or more metal oxides forming a perovskite crystalline structure, wherein the one or more metal oxides may include amounts selected from:
  alkaline earth metals that include magnesium oxide (MgO), calcium oxide (CaO), strontium oxide (SrO), and barium oxide (BaO),
  alkali metals that include lithium oxide ($Li_2O$), sodium oxide ($Na_2O$), potassium oxide ($K_2O$), and rubidium oxide ($Rb_2O$),
  heavy-metal oxides that include lanthanum oxide ($La_2O_3$), cerium oxide ($Ce_2O_3$), neodymium oxide ($Nd_2O_3$), or lead oxide (PbO),
  and,
  transition-metal oxides that include titanium oxide ($TiO_2$), zirconium oxide (ZrO), hafnium oxide (HfO), tantalum oxide ($Ta_2O_3$), and niobium oxide ($Nb_2O_3$).

17. The module of claim 15, wherein the capacitive ceramic element has an electrical permittivity that varies ≤1% over an operating temperature range of −40° C. to +125° C.

18. The module of claim 16, wherein capacitive ceramic element has an electrical permittivity value of $\varepsilon_R \geq 100$.

19. The module of claim 1, further comprising one or more ceramic capacitive elements or one or more resistive elements formed on the semiconductor that are operatively connected to one another and/or the inductor to form an electronic filter.

20. The module of claim 1, wherein the module is in electrical connection with an antenna.

* * * * *